United States Patent [19]
Tomohiro et al.

[11] Patent Number: 6,044,028
[45] Date of Patent: Mar. 28, 2000

[54] SEMICONDUCTOR STORAGE DEVICE AND ELECTRONIC EQUIPMENT USING THE SAME

[75] Inventors: Yasuhiko Tomohiro; Takashi Kumagai, both of Suwa, Japan

[73] Assignee: Seiko Epson Corporation, Tokyo, Japan

[21] Appl. No.: 08/891,822

[22] Filed: Jul. 14, 1997

Related U.S. Application Data

[63] Continuation of application No. 08/732,988, Oct. 16, 1996, abandoned.

[30] Foreign Application Priority Data

Oct. 16, 1995 [JP] Japan ................................. 7-267519
Sep. 13, 1996 [JP] Japan ................................. 8-265475

[51] Int. Cl.[7] .................................................. G11C 7/00
[52] U.S. Cl. ............... 365/200; 365/230.03; 365/230.06
[58] Field of Search ............................. 365/200, 230.03, 365/203, 230.01, 230.06

[56] References Cited

U.S. PATENT DOCUMENTS 4,747,082  5/1988  Minato ................................... 365/222

FOREIGN PATENT DOCUMENTS

| | | |
|---|---|---|
| 59-30294 | 2/1984 | Japan . |
| A-62-75996 | 4/1987 | Japan . |
| A-64-64192 | 3/1989 | Japan . |
| 2-50396 | 2/1990 | Japan . |
| 5-2895 | 1/1993 | Japan . |
| 9-92732 | 4/1997 | Japan . |

*Primary Examiner*—A. Zarabian
*Attorney, Agent, or Firm*—Oliff & Berridge, PLC

[57] ABSTRACT

A semiconductor storage device which can prevent a short-circuit current from flowing therethrough even if a short circuit occurs between main word lines and bit lines. The semiconductor storage device has a plurality of normal memory cell array blocks, each including multiple columns of bit line pairs, sub word lines and normal memory cells. The semiconductor storage device also includes main word lines extending through the plurality of normal memory cell array blocks, a main row selecting decoder for selecting one of the main word lines on the basis of a main row address signal, a sub row selecting decoder for selecting one of the sub word lines depending on one of the main word lines on the basis of a sub row address signal, and a pre-charge circuit for pre-charging a pair of bit lines. The main row selecting decoder has a first setting circuit for inactivating the main word line at a high level potential substantially equal to a potential of a pre-charged bit line pair, while at a low level potential, the main word line is activated. The sub row selecting decoder has a second setting circuit for inactivating the sub word lines when the main word line is in the high level potential. The second setting circuit has an inverting element for receiving and inverting a signal from the main word line, the inverted signal being then outputted therefrom, and a switch for inactivating the sub word lines when the output of the inverting element is in the low level potential.

12 Claims, 16 Drawing Sheets

SEMICONDUCTOR STORAGE DEVICE AND ELECTRONIC EQUIPMENT USING THE SAME

This is a Continuation of application Ser. No. 08/732,988 filed Oct. 16, 1996 now abandoned.

BACKGROUND OF THE INVENTION

1. Field of the Invention

The present invention relates to a semiconductor storage device, and particularly to a divided-word-line type semiconductor storage device and electronic equipment using such a semiconductor storage device.

2. Description of the Prior Art

Such a semiconductor storage device is known, for example, from Japanese Patent Laid-Open Nos. 62-75996 and 64-64192.

One example of these semiconductor storage devices is shown in FIGS. 13A, 13B and 14. FIG. 13A is a schematic block diagram of a known divided-word-line type semiconductor storage device, while FIG. 13B is a block diagram illustrating, in an enlarged scale, a part of the memory cell area in FIG. 13A. FIG. 14 is a circuit diagram illustrating a part of the main row decoder 402 in the semiconductor storage device of FIG. 13A. The known related art will be described with reference to these figures.

Referring now to FIG. 13A, a main row decoder 402 is disposed at the center of parallelly disposed memory cell blocks 400. A sub row decoder 404 is provided for each memory cell block 400. One of main word lines 406 is selected by the main row decoder 402 while one of sub word lines 408 depending on one selected main word line 406 is selected by the corresponding sub row decoder 404.

A mechanism for selecting a main word line 406 through the main row decoder 402 will be described in connection with FIG. 14. FIG. 14 illustrates a system having a NOR gate NOR1 and main word line drivers DRR and DRL each of which is constructed by two inverters connected in series with each other. The input of the NOR gate NOR1 is connected to main-row address signal lines MRAL.

Only when all of the signal lines connected to the input of the NOR gate NOR1 in the main row address signal lines MRAL are in low level (which will be referred simply to "L"), the output of the NOR gate NOR1 becomes high level (which will be referred simply to "H") to activate the main word lines 406. If any one of the signal lines connected to the input of the NOR gate NOR1 in the lines MRAL is in "H", the output of the NOR gate NOR1 becomes "L". Therefore, the main word lines 406 will be in "H" under their selected state and in "L" under their non-selected state.

Next, a mechanism for selecting a sub word line 408 through the sub row decoder 404 will be described with reference to FIG. 13B.

Referring to FIG. 13B, each memory cell MC disposed in each of the memory cell blocks 400 is connected to bit lines BL and /BL for data input/output as well as one of the sub word lines 408. Each of the bit lines BL and /BL is connected at one end to a pre-charge circuit PCC for charging the bit lines BL and /BL when the corresponding memory cell MC is not selected. The input of the sub row decoder 404 is connected to a line branched from the main word line 406 and sub row address signal lines SRAL.

When it is desired to select one of the sub word lines 408 depending on the activated main word line 406, the sub word line 408 is activated by an address signal supplied from the sub row address signal lines SRAL.

At this time, the potential level in the bit lines BL and /BL has previously been in "H" level by the pre-charge circuit PCC under the non-selected state. Pre-charging is one method for improvement in speed and stability, having an advantage that a time to charge a capacitance of a bit line in a data writing/reading operation can be reduced. Thus, one of the memory cells MC will be selected by activating the bit lines BL and /BL and the sub word line 408.

From the viewpoint of high-integration, the divided-word-line type semiconductor storage device is generally constructed to have different wiring layers respectively including sub word lines, main word lines and bit lines, when the bit lines intersect the main word lines. In addition, because the length of wiring is long, the bit and main word lines are formed of metal wire to make the resistance as low as possible.

If the device has two polysilicon layers and two aluminum layers, for example, first and second wiring layers are formed of polysilicon on a substrate of Si while third and fourth layers are formed of aluminum. The layout is selected such that the third layer is used as bit lines and the fourth layer is used as main word lines, for example.

When the aforementioned device structure is formed, however, the following problems are raised.

On production, foreign matters such as particles enter an interlayer at which the metallic bit line layer intersects the metallic word line layer. This produces a short circuit between the bit and main word lines.

In such a type of circuit shown in FIG. 16 wherein the potential of the bit line in the stand-by state has previously been set to be always in ON state ("H" level state) through the pre-charge circuit 430, the aforementioned short circuit causes an electric current to flow from the bit lines BL to the main word line 406 since the main word line 406 and bit lines BL are respectively in "L" and "H" levels under the non-selected state.

This raises a problem in that the memory cells connected to the short-circuited bit lines and the memory cells depending on the sub word line selected by the short-circuited main word line may malfunction.

Such a malfunction can be overcome by providing a redundancy circuit. However, the main word line on question will be fixed to "L" level (non-selection state) and the bit lines will be fixed to "H" level (non-selection state). Therefore, an overcurrent of 1 mA or 2 mA, for example, due to the short circuit will continue to flow through the memory cell area through which only a reduced current of about 0.5 $\mu A$ normally flows. A memory cell in this state, particularly when such a memory cell is used in SRAM or the like and required to keep power consumption in a standby state as low as possible, cannot meet standard requirements for power consumption and is considered to be defective.

Such a proposal as shown in FIG. 15 has been made. FIG. 15 shows a block diagram illustrating a part of a sub row decoder in the semiconductor storage device of the prior art, which diagram is described in "A 21 mW 4 Mb CMOS SRAM for Battery Operation," *ISSCC DIGEST OF TECHNICAL PAPERS* March 1991:WPM3.1: pp46–47.

A system shown in FIG. 15 has a complementary pair of main word lines 410, 412, a sub word line 414 and a sub row decoder 420. The sub row decoder 420 is constructed of a p-channel transistor 424 and n-channel transistors 422, 426. The source and drain of the p-channel transistor 424 are connected parallel to those of the n-channel transistor 422. The sources are connected to the sub word line 414 while the drains are connected to one of sub row address signal lines SRAL. The gate of the n-channel transistor 422 is connected to the main word line 410 (which is selected in "H") while the gate of the n-channel transistor 426 is connected to the main word line 412 (which is selected in "L"). The source, drain and gate of the n-channel transistor 426 are connected to ground, the sub word line 414 and the main word line 412, respectively. Bit lines have been pre-charged to "H".

When the memory cell MC is in its non-selected state, the main word line 410 is in "L" state and the main word line 412 is in "H" state. Thus, the p-channel transistor 424 and the n-channel transistor 422 are off while the n-channel transistor 426 is on. Therefore, the sub word line 414 is placed in "L" through the n-channel transistor 426.

When the memory cell MC is in its selected state, the main word line 410 is in "H"; the main word line 412 is in "L"; and the sub row address signal lines SRAL are in "H". Thus, the p-channel transistor 424 and n-channel transistor 422 are turned on to make the sub word line 414 "H".

However, the system of FIG. 15 raises the following problems:

(1) Although two main word lines 410 and 412 are formed, the similar problem can be raised since a current may flow through the main word line 410 when a short circuit occurs, even if no current flows through the main word line 412.

(2) When the n-channel transistor 422 is turned on and also in its non-selected state, a signal will be transmitted from the sub row address signal lines SRAL to the sub word line 414. This causes the memory cell MC to malfunction.

(3) Providing a complementary pair of main word lines requires one more wiring layer and one more insulating interlayer. If the insulating interlayer is thin, the upper wiring layer tends to be cut due to a thickness difference between layers. If the insulating interlayer is made to be thick, a contact hole for connecting wiring layers becomes deeper, so that a contact resistance is increased. In addition, the layer thickness in the system is increased. This increases the size of a chip in the direction of thickness. Even if the two main word lines can be formed in a single layer, the area of chip required to form these main word lines will be increased. Moreover, a manufacturing cost is increased because of an increase in manufacturing time and in number of producing steps.

(4) The main word line 412 is in "L" during the time period through which the memory cell is selected. If a short circuit occurs, however, the main word line 412 will be temporarily placed in "H" by the short-circuit current. The transistor 424 will be turned off and the transistor 426 will be turned on. This lowers the potential in the sub word line so that the desired selection will not be carried out. This also raises another problem in that the other elements malfunction or are broken down.

Note that the aforementioned technical paper does not mention these problems.

SUMMARY OF THE INVENTION

The present invention was made to solve the aforementioned problems. An object of the present invention is to provide a semiconductor storage device which can avoid flowing a short-circuit current to improve the yield, even if foreign matter between a main word line layer and a bit line layer causes a short-circuit, and also to provide electronic equipment using such a semiconductor storage device.

Another object of the present invention is to provide a semiconductor storage device which can perform the selection of memory cell well by avoiding a malfunction due to the short-circuit current and a malfunction of memory cell, and also to provide electronic equipment using such a semiconductor storage device.

Still another object of the present invention is to provide a semiconductor storage device which can prevent an overcurrent and a malfunction or breakdown of any element except memory cells due to the overcurrent, and which can be designed to have a reduced size, and also to provide electronic equipment using such a semiconductor storage device.

To this end, the present invention provides a semiconductor storage device comprising:

a plurality of normal memory cell array blocks, each of which includes plural columns of bit line pairs, N×n rows of sub word lines and a plurality of normal memory cells disposed at respective intersections between the plural columns of bit line pairs and the N×n rows of sub word lines, the sub word lines being divided into a plurality of blocks in a column direction;

N rows of main word lines extending through the plurality of memory cell array blocks, wherein n of the sub word lines depending on one of the main word lines come into a selectable state by activating the one of the main word lines;

main row selecting means used by all the normal memory cell array blocks for selecting one of the main word lines on the basis of a main row address signal;

block selecting means, each of which is provided for one of the normal memory cell array blocks and outputs a sub row address signal for selecting one of the sub word lines within corresponding one of the normal memory cell array blocks on the basis of a block address signal;

sub row selecting means, each of which is provided for one of the normal memory cell array blocks and selects one of the n sub word lines depending on one of the main word lines selected based on the main row address signal on the basis of the sub row address signal; and pre-charge means for pre-charging one of the plural columns of bit line pairs;

wherein the main row selecting means activates and selects one of the main word lines at a low potential level and inactivates the other main word lines at a high potential level, the high potential level being substantially equal to a potential level of a pre-charged bit line pair of the plural columns of bit line pairs.

In this way, the potential level of the main word line becomes a high level in its inactive state and a low level in its active state. The potential of the main word line in its inactive state is substantially equal to that of the pre-charged bit lines. When a main word line is in its inactive state (or in a non-selection mode in which no normal memory cell is selected), thus, a short-circuit current will not flow through the main word line even if a short circuit is produced between that main word line and a bit line.

At this time, the sub word lines will not be activated even when the potential of the main word line is in its high level. Therefore, any failed normal memory cell will not be selected. If this semiconductor storage device has a redundancy memory cell, the redundancy memory cell can be well selected at this time. The redundancy memory cell may be substituted for a failed normal memory cell regardless of a failed current. This contributes to an improved semiconductor storage device.

According to the present invention, the main row selecting means includes a first setting means which activates and selects one of the main word lines at a low potential level and inactivates other main word lines at a high potential level, the high potential level being substantially equal to a potential level of the pre-charged bit line pair; and the sub row selecting means includes a second setting means which is disposed between one of the main word lines and one of the sub word lines and the second setting means inactivating the one of the sub word lines when the one of the main word lines is at a high potential level; and the second setting means includes an inverting element which receives a signal from the one of the main word lines to invert and output a received signal, and switch means for inactivating the one of the sub word lines when an output of the inverting element is at a low potential level.

Through the first setting means, the potential level of the main word line becomes a high level in its inactive state and a low level in its active state. The potential of the main word line in its inactive state is substantially equal to that of the pre-charged bit lines. When a main word line is in its inactive state (or in a non-selection mode in which no normal memory cell is selected), thus, a short-circuit current will not flow through the main word line even if a short circuit is produced between that main word line and a bit line.

At this time, by the second setting means, the sub word lines will not be activated even when the potential of the main word line is in its high level. Therefore, any failed normal memory cell will not be selected. If this semiconductor storage device has a redundancy memory cell, the redundancy memory cell can be well selected at this time. The redundancy memory cell may be substituted for a failed normal memory cell regardless of a failed current. This contributes to an improved semiconductor storage device.

When the main word line is placed in its inactive state through the high level potential, the output of the inverting element becomes the low level potential. Thus, the sub word line is inactivated through the switch means when the output of the inverting element is in its low level potential. This will prevent a failed normal memory cell from being undesirably selected. In addition, the switch means can reliably inactivate the sub word line with the potential thereof being grounded when any normal memory cell is not selected.

The first setting means can be shared by all the memory cell array blocks without provision of one first setting means in each of the blocks. This enables the layout to be reduced.

According to the present invention, the semiconductor storage device further comprises at least one sub row address signal line which is connected between the sub row selecting means and the block selecting means to be activated by the sub row address signal; and wherein the switch means includes:

a first switch for activating the one of the sub word lines when the one of the main word lines and the at least one sub row address signal line are active; and a second switch for lowering the potential of the one of the sub word lines to a ground potential to inactivate the one of the sub word lines on the basis of an output of the inverting element when the one of the main word lines is inactive.

The first switch activates the main word line (or places the main word line at its low level potential) when no short circuit is produced. The first switch also activates the sub word line (or places the sub word line at its high level potential) when the sub row address signal line is active (or in its high level potential). Thus, the normal memory cells can be well selected in the normal manner.

If a short circuit is produced, the second switch inactivates the main word line (or places the main word line at its high level potential) and also inactivates the sub word line (or places the sub word line at its low level potential). Thus, the normal memory cells can be prevented from being placed in their available state. Thus, the damage due to the short circuit can be prevented by selecting a redundancy memory cell. Furthermore, the short-circuit current can be prevented from flowing through the main word line, and the inverting element can prevent any operational failure in the normal memory cells, an occurrence of overcurrent and so on.

It is preferred in the present invention that the first switch is formed by a transmission gate disposed between the one of the sub word lines and the at least one sub row address signal line; and wherein a first control terminal and a second control terminal of the transmission gate are connected to the one of the main word lines and the output of the inverting element, respectively, for controlling a continuity between the one of the sub word lines and the at least one sub row address signal line.

The transmission gate is switched on to select a sub word line on the basis of the sub row address signal when the normal memory cells are to be selected. The switching operation can be reliably performed by well inputting the sub row address signal into the sub word line, depending on the potential of the main word line. If a short circuit occurs and when a failed normal memory cell is not to be selected, the transmission gate is switched off to arrest the supply of the sub row address signal. This switching operation can be well executed by causing the transmission gate to be switched on or off. This also means that the elements can be simplified and the layout area can be reduced.

It is preferred in the present invention that the second switch is a switching element which is connected between the one of the sub word lines and a ground line and controlled by the output of the inverting element. It is suitable to use an n-channel transistor as a switching element, but a p-channel transistor, a bipolar transistor or the like is also applicable. FIG. 3 shows an example in which a p-channel transistor is used. These switching elements can reliably change the potential of the sub word line for the ground potential such that a surplus current can be discharged from the sub word line.

According to the present invention, the semiconductor storage device further comprises at least one sub row address signal line which is connected between the sub row selecting means and the block selecting means to be activated by the sub row address signal; and wherein the second setting means has gate means which receives an output of the at least one sub row address signal line and the output of the inverting element, and activates the one of the sub word lines when the one of the main word lines and the at least one sub row address signal line depending on the one of the main word lines are active, and inactivates the one of the word lines when the one of the main word lines is inactive.

Activation and inactivation of the sub word line can be reliably performed since the gate means is operated through the logics of the sub row address signal and main word line lines. Therefore, even if the main word line is placed in its high level potential on occurrence of a short-circuit current, the sub word line can be placed in its low level potential and will not receive a signal from the sub row address signal line. Therefore, the sub word line becomes inactive such that a failed normal memory cell will not be selected.

According to the present invention, there is provided a semiconductor storage device comprising:

a plurality of normal memory cell array blocks, each of which includes plural columns of bit line pairs, N×n rows of sub word lines and a plurality of normal memory cells disposed at respective intersections between the plural columns of bit line pairs and the N×n rows of sub word lines, the sub word lines being divided into a plurality of blocks in column direction;

redundancy memory cell array blocks, each of which is provided for one of the normal memory cell array blocks, and has a redundancy memory cell which can be substituted for any failed one of the normal memory cells;

N rows of main word lines extending through the plurality of normal memory cell array blocks and the redundancy memory cell array blocks, wherein n of the sub word lines depending on one of the main word lines come into a selectable state by activating the one of the main word lines;

main row selecting means which is used by all the normal memory cell array blocks and selects one of the main word lines by setting a potential of the one of the main word lines at a high potential level on the basis of a main row address signal;

block selecting means, each of which is provided for one of the normal memory cell array blocks and outputs a sub row address signal for selecting one of the sub word lines within corresponding one of the normal memory cell array blocks on the basis of a block address signal;

sub row selecting means, each of which is provided for one of the normal memory cell array blocks and selects one of the n sub word lines depending on one of the main word lines selected by the main row address signal on the basis of the sub row address signal;

pre-charge means for pre-charging one of the plural columns of bit line pairs; and at least one sub row address signal line which is connected between the sub row selecting means and the block selecting means to be activated by the sub row address signal; and wherein the block selecting means has change means for changing a failed one of the normal memory cells for a redundancy memory cell in the redundancy memory cell array block in response to a redundancy selection signal used for selecting the redundancy memory cell;

wherein the main row selecting means has potential setting means for setting a potential of one of the main word lines used to select a failed one of the normal memory cells at a high potential level substantially equal to a potential level of pre-charged one of the bit line pairs at all times when the change means changes the failed one of the normal memory cells for the redundancy memory cell; and wherein the sub row selecting means has control means responsive to an inhibiting signal activated when the selection of the failed one of the normal memory cells is inhibited to inactivate n of the sub word lines connected to the failed one of the failed normal memory cells.

This aspect of the present invention may also have potential setting means for setting the potential of the main word lines at a level equal to that of the bit lines when any normal memory cell is not selected. The potential setting means can prevent an excess current from flowing through the memory cell array blocks even if a short circuit occurs between the bit lines and the main word lines due to the presence of a foreign matter between the bit line layer and the main word line layer. Thus, a redundancy memory cell can be driven well to improve the yield. Furthermore, the other elements can be prevented from failing in operation.

From the fact that the change means is provided, the main word line can be placed in its high level potential to activate the sub word line such that a normal memory cell can be selected in the normal manner when there is no short circuit. In other words, the potential setting means maintains the main word line which has selected the normal memory cell at its high level potential only when a short circuit occurs between the main word line and the bit lines and a redundancy memory cell is then to be substituted for the failed normal memory cell through the change means.

The control means can prevent the inflow of the short-circuit current, the malfunction of the normal memory cell and so on by inactivating a sub word line depending on a failed normal memory cell. In addition, a failure in operation can be prevented by using a redundancy memory cell to obtain an improved product and to improve the yield. At this time, the selection of normal memory cell can be arrested in spite of the logic of the sub row address signal since an inhibiting signal used to inhibit the selection of normal memory cell is supplied to the control means.

According to the present invention, the potential setting means comprises:

first potential setting means for setting a potential of the one of the main word lines substantially equal to a potential of pre-charged one of the bit line pairs always at a time of changing by the change means;

second potential setting means for setting one of the main word lines to a high potential level based on an output of the main row address signal to make the normal memory cells to come into a selectable state before the changing by the change means; and switchover means for performing the switching of the first and second potential setting means from one to another.

The first potential setting means can prevent a short-circuit current from flowing through the semiconductor storage device by setting the potential level of the main word line at the high level potential when a short circuit occurs. The second potential setting means can execute the normal operation by setting the potential of the main word line at a high level when the selection of normal memory cell is to be made and at a low level when the selection is not to be performed. Only when the short circuit occurs, therefore, the switchover means cancels the second potential setting means and selects the first potential setting means, thereby overcoming any problem raised by the short circuit.

According to the present invention, the semiconductor storage device further comprises at least one main row address signal line which is connected to the main row selecting means and activated by the main row address signal; and wherein the switchover means has a programming element interposed and connected between a ground line and a first power source;

wherein the second potential setting means includes a first switch means which is disposed between a second power source and one of the main word lines, a first control terminal of the first switch means being connected to the programming element; and wherein the first potential setting means includes a second switch means which is disposed between the at least one main row address signal line and the one of the main word lines, a second control terminal of the second switch means being connected to the programming element.

The main word line can be set at the high level potential by cutting the programming element such as fuse, at any time when a redundancy memory cell is to be selected. On the normal operation, the normal memory cell can be selected without cutting of the fuse since the main word line is in its high level potential and the sub word lines are active.

The control means includes gate means which is disposed between one of the main word lines and one of the sub word lines and which inactivates the one of the sub word lines independently of a logic of the sub row address signal when the inhibiting signal is active.

When the main word line is in the high level potential, the inhibiting signal is arrested for selecting the normal memory cells. When the main word line is in the low level potential, the inhibiting signal is outputted for arresting the selection of normal memory cell. In such a manner, the logic of the control means can be simplified by the gate means.

According to the present invention, an insulation film is interposed between the bit line pairs and the main word lines. Even if the bit line pairs and main word lines are formed of metal, the insulation can be reliably carried out at the intersections therebetween. Furthermore, even if foreign matter causes a short circuit between the main word lines and the bit lines, no problems will occur. Thus, an improved semiconductor storage device can be provided.

According to the present invention, there is provided electronic equipment having the aforementioned semiconductor storage device. Even if a plurality of short-circuit areas are formed in a semiconductor storage device during production, the electronic equipment can be manufactured with an improved quality. This also means that the number of usable chips is increased without wastefulness, thereby improving the yield and quality and so on. The semiconductor storage device of the present invention can be preferably used in any electronic equipment as a storage device.

Further objects, details and advantages of the invention will be apparent from the following detailed description, when read in conjunction with the drawings.

DETAILED DESCRIPTION OF THE PREFERRED EMBODIMENTS

Some preferred embodiments of the present invention will now be described in detail with reference to the drawings.

The following is a description of the overall arrangement of the preferred embodiment.

Figure 1:
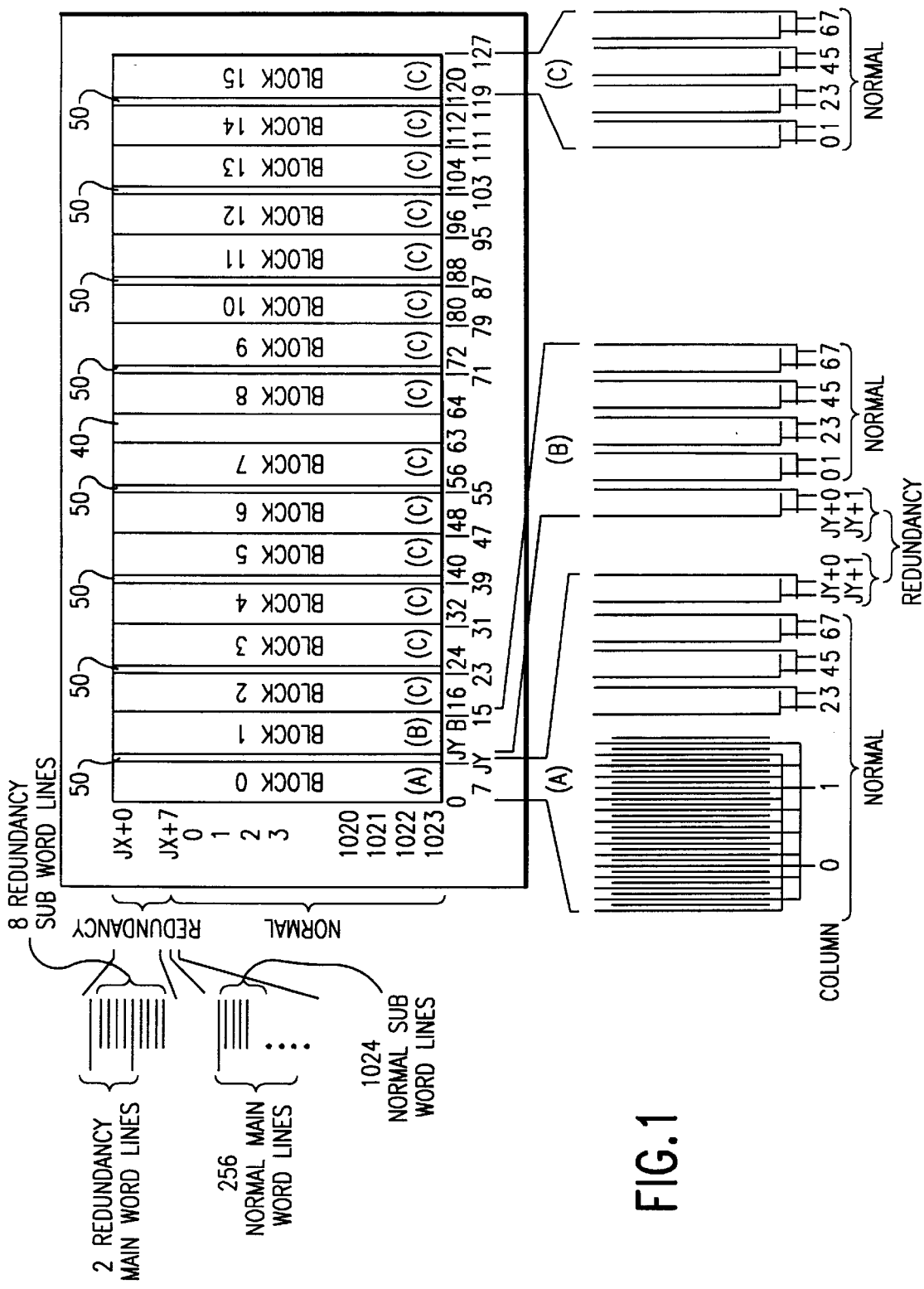
FIG. 1 is a schematic diagram of a block division in a semiconductor storage device according to the present invention.

Prior to description of first and second setting means and others by which the present invention is characterized, the overall arrangement of a semiconductor storage device will be described with reference to FIGS. 1 and 2. FIG. 1 is a schematic diagram illustrating a block division of memory cell array blocks in a semiconductor storage device according to the present invention while FIG. 2 is a schematic diagram illustrating, in an enlarged scale, two blocks among sixteen blocks shown in FIG. 1.

As shown in FIG. 1, the semiconductor storage device of the first embodiment is formed by dividing it into blocks in a column direction. The semiconductor storage device comprises a plurality (e.g., 16) of memory cell array blocks 10 represented by block numbers 0–15; a main row selecting decoder 40 interposed between the two memory cell array blocks 10 represented by the block numbers 7 and 8; and a pair of sub row selecting decoders 50 disposed between each pair of adjacent memory cell array blocks 10. As can be seen from FIG. 2, the semiconductor storage device also comprises column redundancy memory cell array blocks 20, main word lines 30, sub word lines 32, block selecting decoders 60, column selecting decoders 70, block control circuits 80 and sense amplifiers 90.

Figure 2:
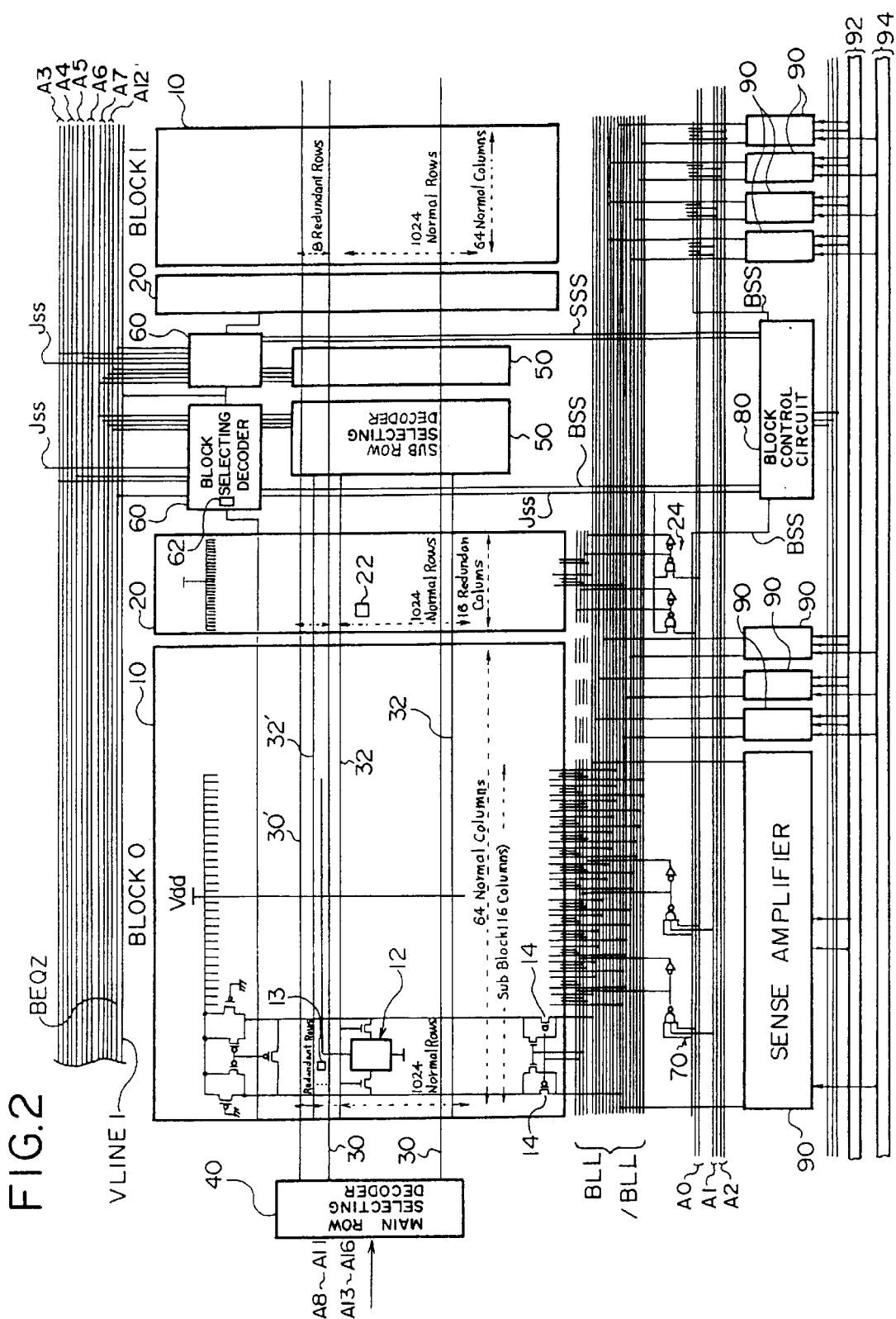
FIG. 2 is a schematic diagram illustrating, in an enlarged scale, two blocks among 16 blocks shown in FIG. 1.

For example, each of the memory cell array blocks 10 comprises, as shown in FIG. 2, sixty-four columns of bit line pairs BL, /BL; sub word lines 32 equal in number to 256×4=1,024 rows; 1,024×64 of normal memory cells, each of which is connected to one of the intersections between the bit line pairs BL, /BL and the sub word lines 32; 8×64 of row redundancy memory cells 13 disposed on the VDD side of the normal memory cells 12; and column gates 14. Each of the row redundancy memory cells 13 may be substituted for a failed memory cell in the corresponding row of normal memory cells 12.

Each of the column redundancy memory cell array blocks 20 is disposed in the corresponding one of the memory cell array blocks 10 and includes a column redundancy memory cell 22 which can be substituted for a failed memory cell in the corresponding column of normal memory cells 12.

The number of the main word lines 30 is equal, for example, to 256. The main word lines 30 extend through the memory cell array blocks 10 and redundancy memory cell array blocks 20. When any one of the main word lines 30 is activated, the corresponding one of the sub word lines 32 can be selected. The 256 main word lines 30 are shared by all the sixteen memory cell array blocks 10. The first embodiment further comprises two redundancy main word lines 30', eight redundancy sub word lines 32' and sixteen pairs of redundancy bit lines BL, /BL, all of which are connected to the row redundancy memory cells 13.

The main row selecting decoder 40 is connected to the 256 main word lines 30 and shared by all the memory cell array locks 10. The main row selecting decoder 40 is also connected to a plurality of main row address signal lines (not shown) to which main row address signals are supplied. One of the main word lines 30 is activated and selected on the basis of high-order main row address signals A8–A11 and A13–A16 which are supplied thereto through the main row address signal lines.

Each sub row selecting decoder 50 is provided in every memory cell array block 10 and functions to select one of the sub word lines 32 (e.g., four) depending on the one selected main word line 30, on the basis of the sub row address signals. The 1,024 rows of the sub word lines 32 are connected to the sub row selecting decoder 50 in each of the blocks 10. The sub row selecting decoder 50 is connected to a plurality of sub row address signal lines 34 to which the sub row address signals are supplied. The sub row selecting decoder 50 will be described in more detail hereinafter.

Each of the block selecting decoders 60 is provided in every memory cell array block 10. The block selecting decoder 60 receives any two of the block selecting address signals A3–A6 and also the low-order sub row address signals used to select the sub word line 32. The block selecting decoder 60 then responds to the block selecting address signals A3–A6 for selecting any one of the memory cell array blocks 10. The block selecting decoder 60 also functions to output the sub row address signals used to select the sub word line 32 in the one selected memory cell array block 10. The block selecting decoder 60 is connected to a voltage-boosted line VLINE1.

It is preferred that the block selecting decoder 60 is in the form of a NAND gate circuit which receives any two (e.g., A3 and A5) of the block selecting address signals A3–A6. Sub row address signal lines 34 to be activated by the sub row address signals are disposed between the sub row selecting decoders 50 and the block selecting decoders 60.

As shown in FIG. 2, the block selecting decoder 60 further includes a change means 62 which receives a redundancy selection signal JSS to change a malfunctioning normal memory cell 12 for a column redundancy memory cell 22 in the column redundancy memory cell array block 20.

If the block selecting decoder 60 receives signals A3 and A5, the block selecting decoder 60 outputs a block selection signal BSS of logic "H" which is in turn input to the memory cell array block 10 through the block control circuit 80.

The bit line pairs BL and /BL are connected to signal data lines BLL and /BLL through the column gates 14.

Each of the column selecting decoders 70 is formed by a NAND gate and other components and supplies a column selection signal to the respective one of the column gates 14 to drive it. The column selecting decoder 70 receives block selection signals BSS and column address signals A0–A2 to output a signal used to select all the eight pairs of bit lines BL and /BL in one memory cell array block 10 toward the column gates 14. In other words, as shown in FIG. 1, one memory cell array block 10 is divided into eight column numbers 0–7 for the eight pairs of bit lines selected at the same time.

The block selection signals BSS are generated by the block selecting decoder 60 and then inputted into the column selecting decoders 70 through the block control circuit 80. The redundancy selection signals JSS which are used to select the column redundancy memory cells 22 are inputted into the redundancy column gates 24 through the block selecting decoders 60 to drive these gates 24 so that the redundancy bit lines BL and /BL are selected. Note that the selection of the main word lines 30 in a row direction to select the column redundancy memory cells 22 is also carried out on the basis of the address signals.

The signal data lines BLL and /BLL are connected to read and write buses 92, 94 through sense amplifiers 90.

In such a manner, one of the sub word lines 32 within one block is activated by the block address signals A3–A6, the main and sub row address signals A7–A16 while eight pairs of bit lines BL and /BL within one block are selected by the block address signals A3–A6 and column address signals A0–A2. Thus, data can be simultaneously read out of and/or written in eight memory cells 10 in a row direction.

The following is a description of the Sub Row Selecting Decoder with First Setting Means and the Main Row Selection Decoder with Second Setting Means.

Figure 3:
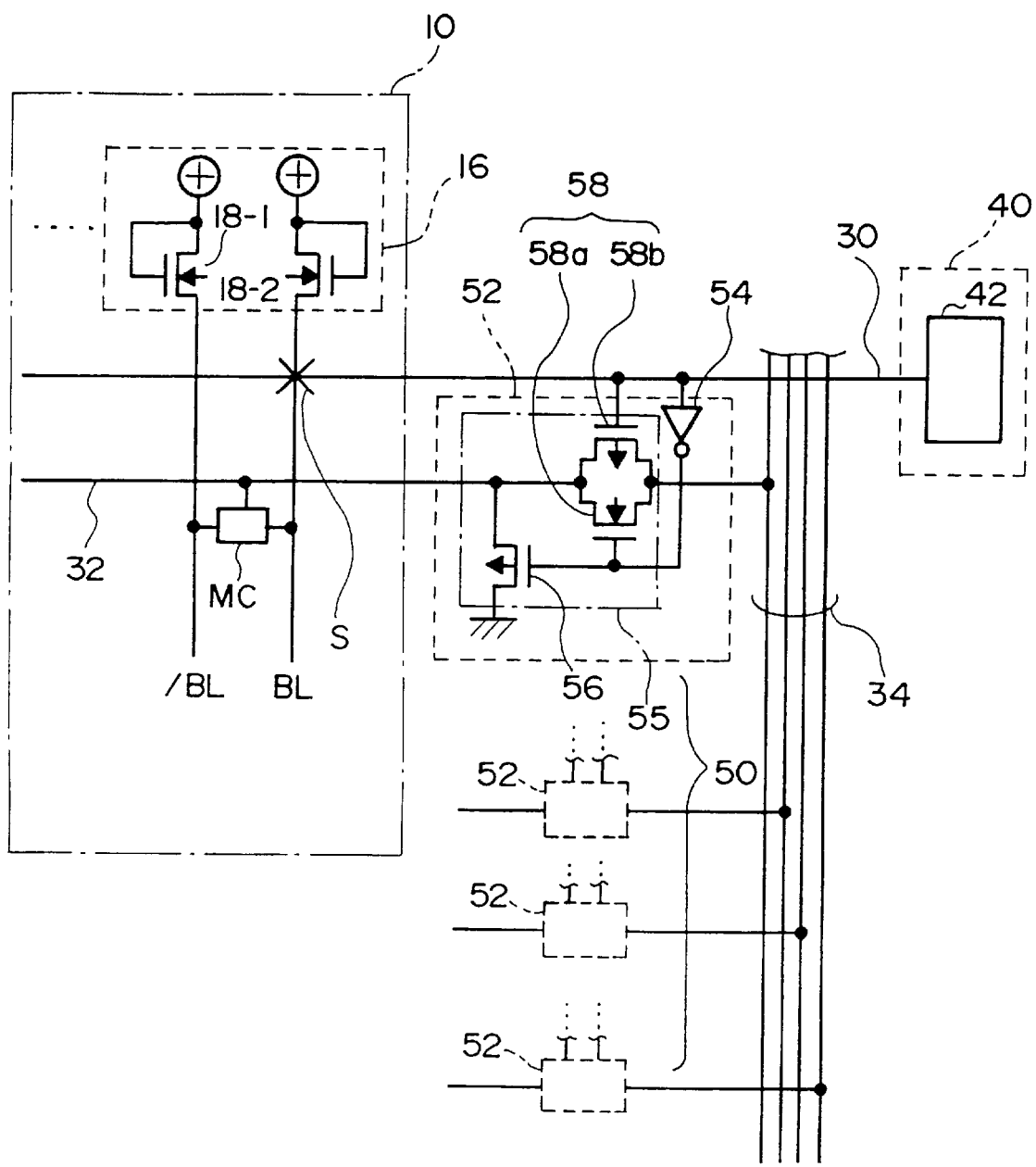
FIG. 3 is a circuit diagram illustrating one embodiment of a semiconductor storage device according to the present invention.

The sub row selecting decoder 50 including the first setting means and the main row selecting decoder 40 including the second setting means will now be described with reference to FIG. 3. FIG. 3 is a block diagram illustrating, in an enlarged scale, a part of the semiconductor storage device shown in FIG. 1.

Referring now to FIG. 3, there are shown a pre-charge circuit 16, complementary bit lines BL, /BL, a main word line 30, a sub word line 32, a main row selecting decoder 40, sub row selecting decoders 50 and so on.

The main row selecting decoder 40 shown in FIGS. 1 and 2 includes first setting means 42, as shown in FIG. 3.

The first setting means 42 is connected to the main word line 30, and functions to set the potential of the main word line 30 which corresponds to the normal memory cell 12 at a level "H" equal to the potential "H" of the pre-charged pair of bit lines BL, /BL when the normal memory cell 12 is switched to a column redundancy memory cell 22 due to a malfunction. Therefore, the potential of the main word line 30 is "L" (active) when the normal memory cell 12 is selected and "H" (inactive) when the normal memory cell is not selected.

The sub row selecting decoder 50 shown in FIGS. 1 and 2 includes a plurality (e.g., four stages) of second setting means 52, as shown in FIG. 3.

Each of the second setting means 52 is disposed between the main word line 30 and at least one sub word line 32 when the first setting means is to be set and have a function to set the potential of the failed main word line 30 at a level opposite to that of the at least one sub word line 32. The second setting means 52 includes an inverting element 54 and a switch means 55.

The inverting element 54 is connected between the switch means 55 and the main word line 30 and have a function to invert the signal from the main word line 30 and to supply the inverted signal to the switch means 55. The inverting element may be in the form of an inverter or the like.

The switch means 55 switches the sub word line 32 from active to inactive or vice versa. The switch means 55 comprises a switching element (e.g., a p-channel transistor 56) used as a second switch for inactivating the sub word line 32 and setting it at the ground potential, and a transmission gate 58 used as a first switch for activating the sub word line 32. Note that it is suitable to use an n-channel transistor as a switching element, when the sub word line is set to a ground potential, but a p-channel transistor, a bipolar transistor or the like is also applicable. FIG. 3 shows an example in which a p-channel transistor is used.

The p-channel transistor 56 is a discharge transistor which is disposed between the ground line and the sub word line 32 and lowers the potential of the sub word line 32 to the ground potential or "L" level when the main word line 30 is not selected. Therefore, the gate electrode of the p-channel transistor 56 functioning as a control terminal is connected to the output of the inverting element 54.

The transmission gate 58 is disposed between the sub word line 32 and the sub row address signal line 34 and includes a first control terminal connected to the main word line 30 and a second control terminal connected to the gate electrode of the p-channel transistor 56 and the output of the inverting element 54, respectively. The transmission gate 58 controls the continuity between the sub word line 32 and the sub row address signal line 34. The transmission gate 58 further includes an n-channel transistor 58a and a p-channel transistor 58b. The gate terminal of the p-channel transistor 58b is connected to the main word line 30 while the gate terminals of the n-channel transistor 58a and p-channel transistor 56 are connected to the main word line 30 through the inverting element 54. The transmission gate 58 may be used as a second switch to reduce the number of elements and to achieve high integration more easily.

It is assumed herein that in the actual arrangement, the bit lines BL and /BL intersect the main word line 30 and sub word line 32 and that the bit lines and main word line 30 are formed in first and second metal wiring layers (the details of which will be described in connection with the fourth embodiment).

The pre-charge circuit 16 is connected to a source potential at one end of the bit line BL through n-channel transistors 18-1 and 18-2. The gate terminals of the n-channel transistors 18-1 and 18-2 are connected to the source potential. The bit line pre-charge circuit 16 is shown to be formed by the n-channel transistors 18-1 and 18-2. However, the pre-charge circuit 16 may be formed by p-channel transistors or a combination of p-channel and n-channel transistors.

The following is a description of the operation of the memory.

The operation of the memory thus formed will be described with reference to FIG. 3. A cross (x) in FIG. 3 illustrates a short circuit produced at an intersection between the main word line 30 and the bit line BL because of a foreign matter.

When there is no short circuit and if the main word line 30 is not selected and placed in "H", the transmission gate 58 is turned off and the p-channel transistor 56 is switched on. Thus, the potential of the sub word line 32 is lowered to "L" level by the p-channel transistor 56. At this time, the sub word line 32 will not be selected.

When the main word line 30 is selected and placed in "L", the transmission gate 58 is turned on and the p-channel transistor 56 is switched off. Since the p-channel transistor 56 is in its OFF state, the sub word line 32 will not be lowered to the ground potential and will receive an address signal transmitted from the sub row address signal line 34. Thus, the sub word line 32 will be placed in "H" if the signal from the sub row address signal line 34 is "H". If the signal is "L", the sub word line 32 will be placed in "L" and will not be selected.

Where a short circuit S exists between the main word line 30 and the bit line BL as shown in FIG. 3, all of the memory cells MC connected to the bit line BL and the normal memory cells 12 connected to the sub word line 32 depending on the main word line 30 will malfunction. Therefore, a column redundancy memory cell 22 or a row redundancy memory cell 13 is selected so that it will be substituted for the corresponding failed normal memory cell 12 (which will be described in detail latter). In other words, the column redundancy memory cell 22 is selected during the non-selection of normal memory cell 12.

Both the main word line 30 and bit lines BL, /BL short-circuited with each other are fixed to "H" since no normal memory cell 12 is selected when and after a redundancy memory cell is used. Thus, by using the redundancy memory cell, any short-circuit current will not flow through the semiconductor storage device and a nondefective product can be provided.

Figure 4:
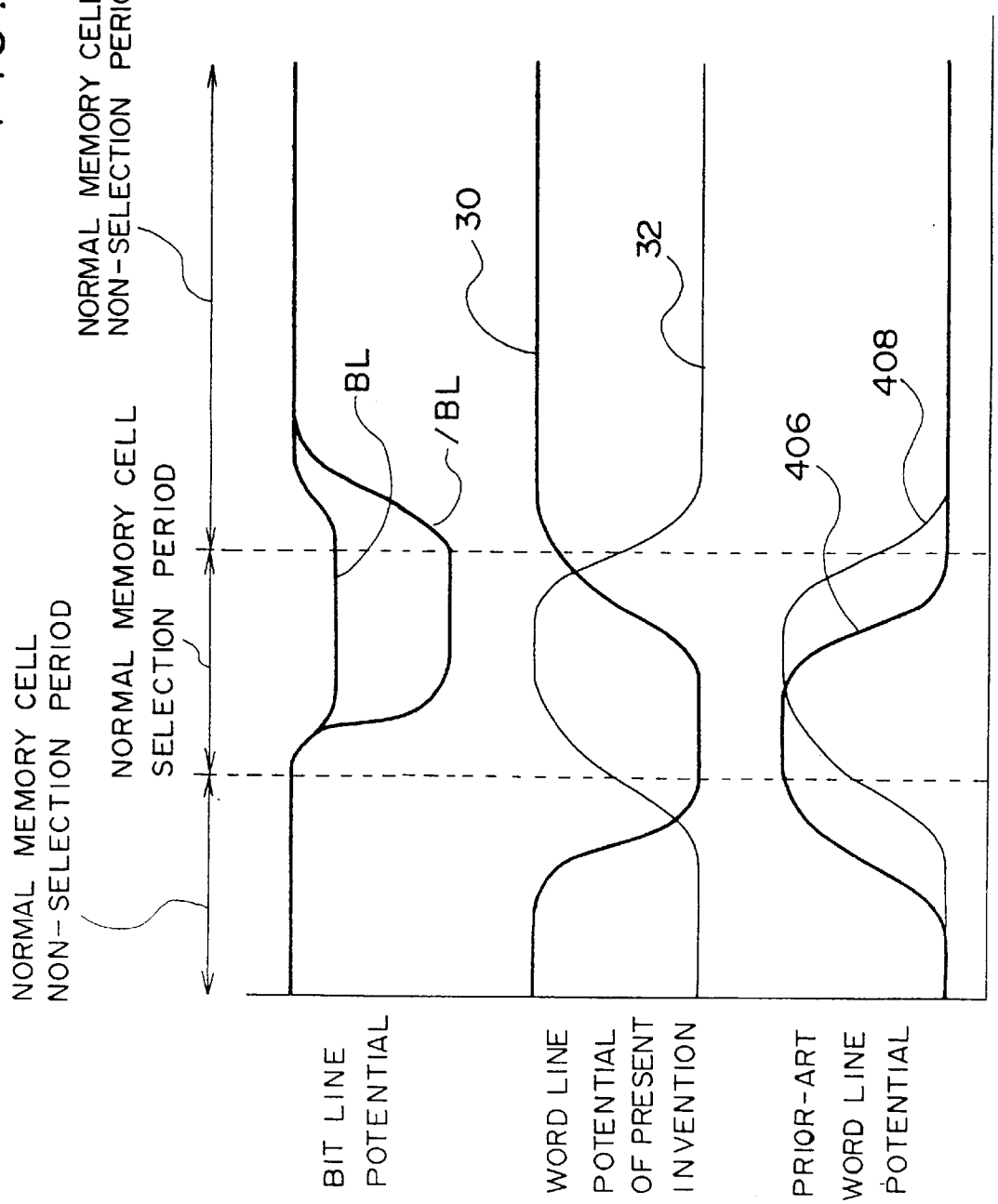
FIG. 4 is a graph of the potential states in the word lines of the semiconductor storage device according to the present invention when the bit line has already been set to "H".

Changes in the potential state when the main word line 30 is selected and not selected in this embodiment will be described with reference to FIG. 4. FIG. 4 shows the potential states of the main word line 30 and sub word line 32 depending thereon according to the present invention. In this figure, the voltage level is "H" when no bit line is selected.

When no sub word line 32 is selected, both the bit lines BL and /BL are pre-charged to "H". When the main word line 30 is shifted from the non-selection state ("H") to the selection state ("L"), the potentials of the bit lines BL and /BL are separated into "H" and "L". In FIG. 4, the potential of the bit line BL during the selection period is slightly lower than that of the same bit line during the non-selection period because leakage may occur at the data lines or the like connected to the memory cells MC or the bit line BL.

Figure 16:
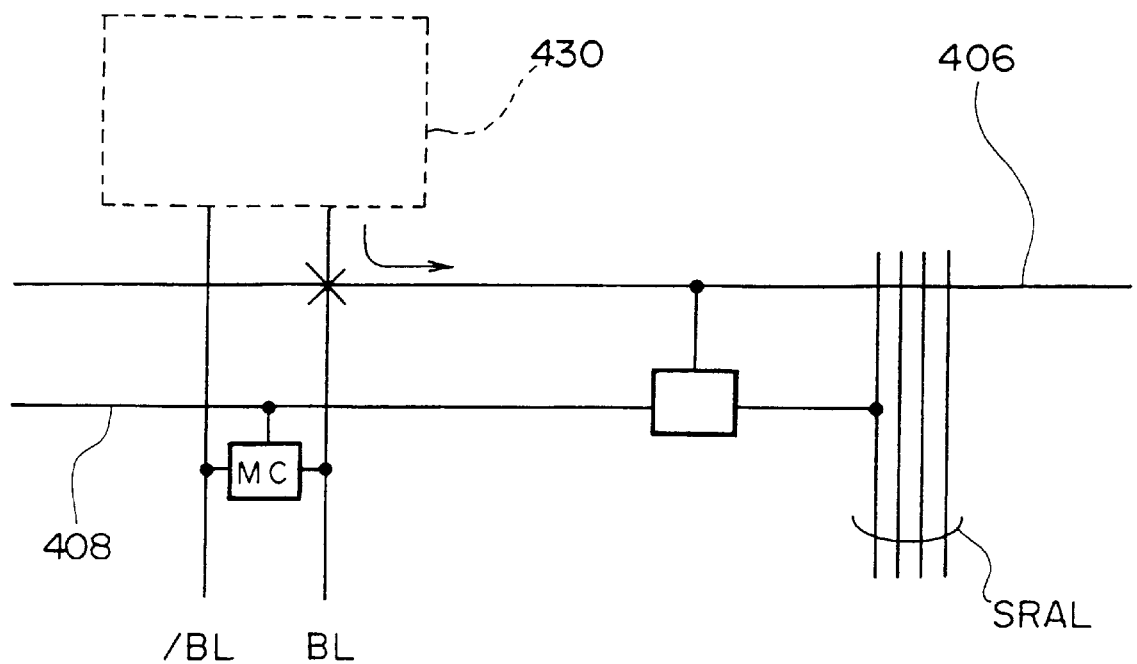
FIG. 16 is a schematic block diagram illustrating various problems raised in known semiconductor storage devices.

When the main word line 30 is placed in the non-selection state ("H") after termination of the selection period, the sub word line 32 is also in the non-selection state ("L"). Thus, the bit lines BL and /BL are charged to "H" by the pre-charge circuit 16. In this embodiment, the main word line 30 is "H" in the non-selection and "L" in the selection, unlike the main word line 406 (see FIG. 16) in the semiconductor storage device according to the prior art.

Therefore, the short-circuit current will not flow through the semiconductor storage device of the present invention since the potential of the bit lines BL and /BL is equal to that of the main word line 30 in the non-selection state. Furthermore, since the potential of the main word line 30 is "H" and the potential of the sub word line 32 is "L" in the non-selection state, wrong selection of memory cells and flowing of overcurrent through the normal memory cell can be prevented.

The first embodiment provides the following advantages:

(1) The first setting means sets the potential level of the main word line at the high level potential when it is inactive and at the low level potential when the main word line is active. The potential of the inactive main word line becomes substantially equal to that of the pre-charged bit lines. Thus, any short-circuit current will not flow through the main word line even if a short circuit occurs between the bit lines and the main word line when the main word line is inactive (or in the non-selection state in which no normal memory cell is selected).

At this time, the second setting means will not activate the sub word line even if the potential of the main word line is in the high level potential. Thus, any failed normal memory cell will not be selected. On the other hand, the corresponding redundancy memory cell is well selected. Thus, a nondefective product can be provided.

According to the present embodiment, a short-circuit current will not flow from the bit lines to the main word line when a short circuit occurs between the main word line and the bit lines and also even if that main word line is during the non-selection period. In addition, by using the redundancy memory cell to prevent the failure in operation, a nondefective product can be provided and the yield will be improved.

(2) When the main word line is inactivated at a high level potential, the output of the inverting element becomes the low level potential. The switch means then inactivates the sub word line to prevent a selection of a failed normal memory cell. In addition, the switch means lowers the potential of the sub word line to the ground potential to inactivate it in a reliable manner when no normal memory cell is selected.

(3) The first setting means can be shared by all the memory cell array blocks, rather than provision of a plurality of first setting means one in each of the blocks. Therefore, the layout can be reduced.

(4) When there is no short circuit, the first switch activates the sub word line (or places it in the high level potential) when the main word line is active (in the low level potential) and the sub row address signal line is active (in the high level potential). Thus, the normal memory cells can be well selected in the normal manner. When the first switch is in the form of a p-channel transistor, the potential of the sub word line can be reliably lowered to the ground potential to discharge any excess current from the sub word line.

When a short circuit occurs, the second switch inactivates the main word line (or places it in the high level potential) and inactivates the sub word line (or places it in the low level potential). This can prevent the normal memory cells from being placed in their available state. Thus, a redundancy memory cell can be selected and used. Furthermore, a short-circuit current will be prevented from flowing through the main word line. The inverting element can prevent malfunction of the normal memory cell, the inflow of overcurrent and so on.

(5) When a normal memory cell is to be selected, the transmission gate is switched on to select the sub word lines on the basis of the sub row address signals, resulting in selection of the normal memory cell. The sub row address signals can be well inputted into the sub word lines by the use of the main word line potential. Thus, the switching operation can be carried out in a reliable manner. When a short circuit occurs, any sub row address signal will not be supplied to the sub word lines and the failed normal memory cell will not be selected. This switching operation can be well performed by turning the transmission gate on or off. Furthermore, the components can be simplified and the layout area can be reduced.

(6) Each of the memory cell array blocks can be selected by the block selecting means which can be used as a redundancy memory cell selector on the basis of the redundancy selection signal when no normal memory cell is to be selected.

The following is a description of a second embodiment of the invention.

Figure 5:
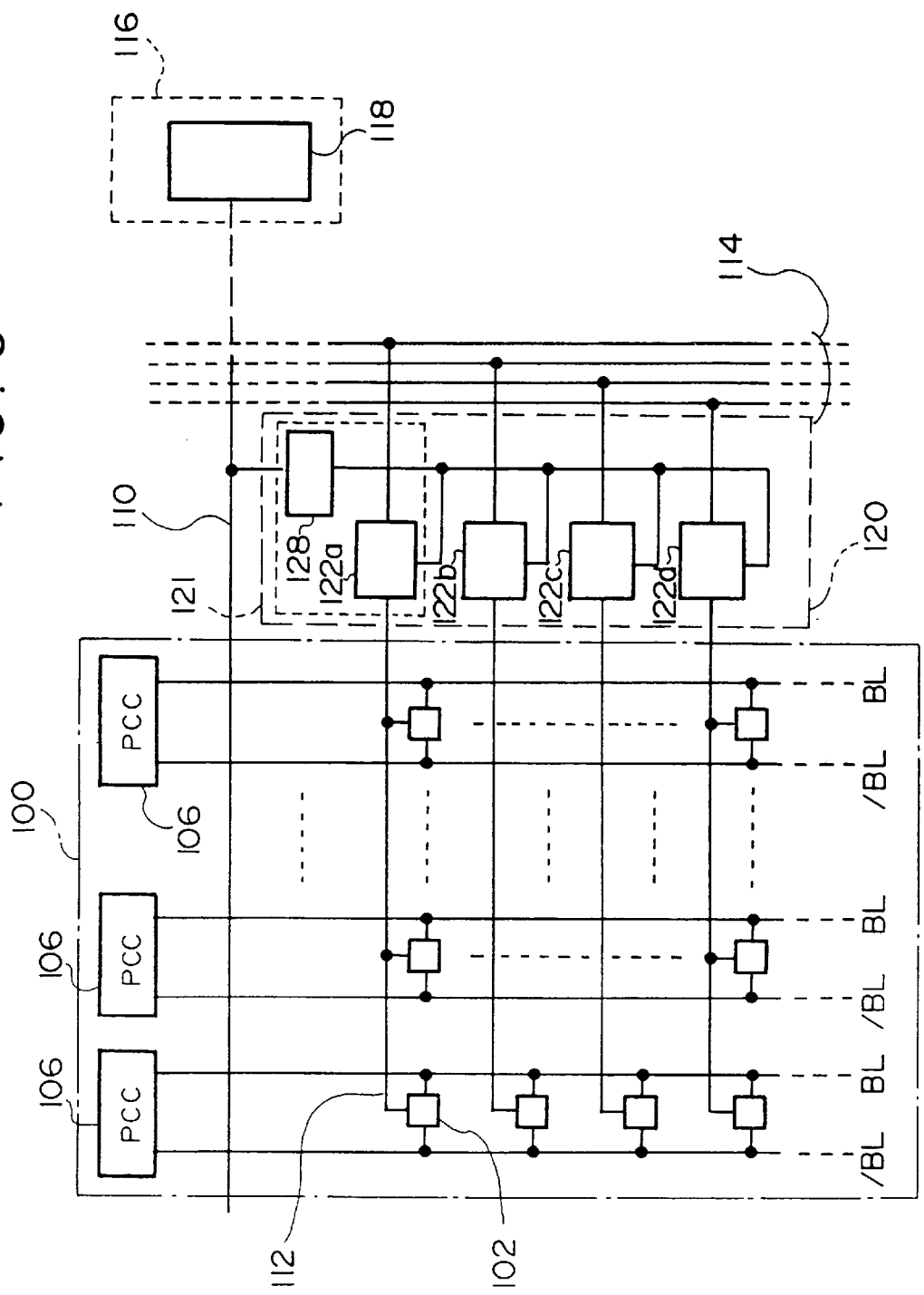
FIG. 5 is a block diagram illustrating another embodiment of a semiconductor storage device according to the present invention.
Figure 6:
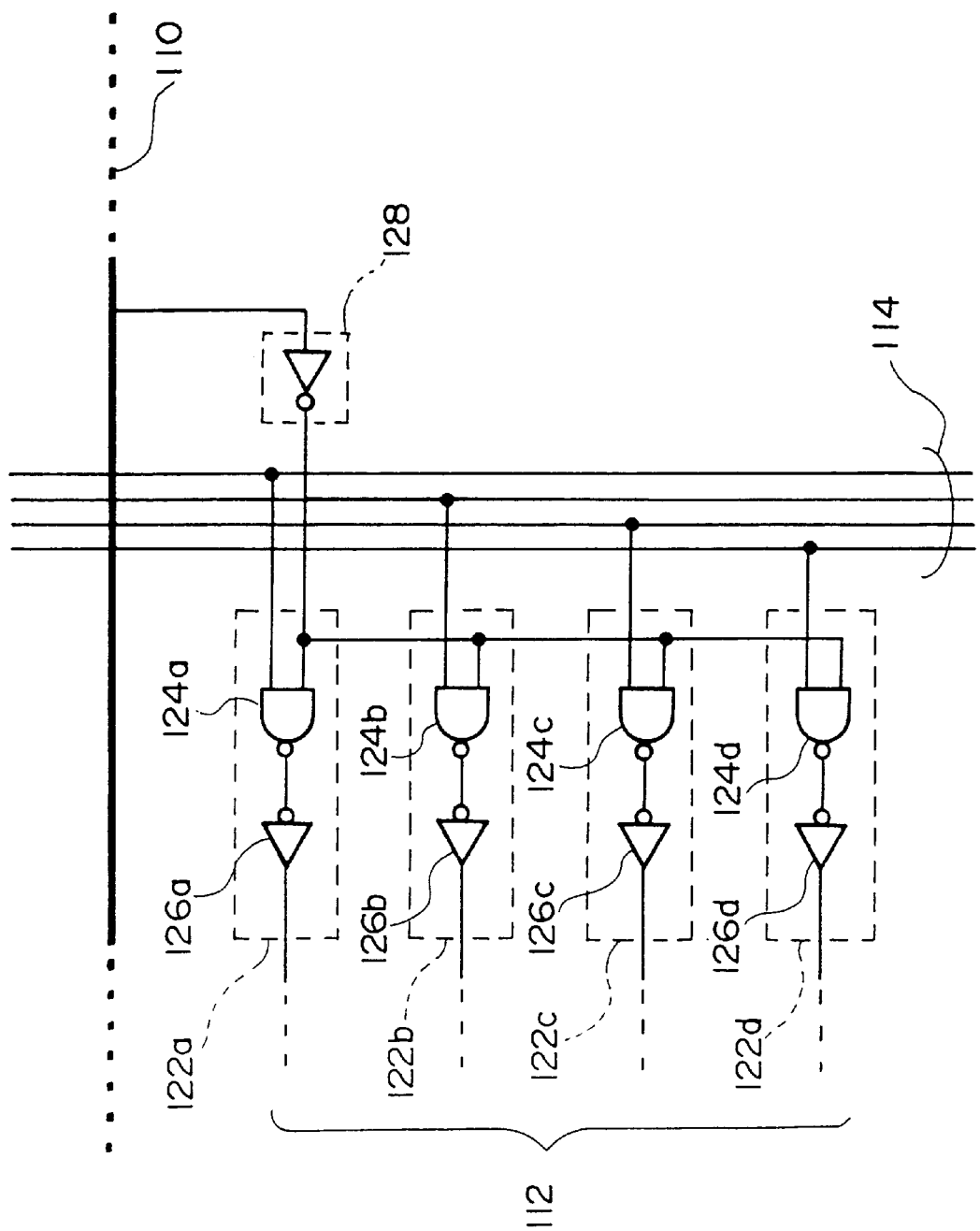
FIG. 6 is a circuit diagram of a sub row selecting means usable in the circuit of FIG. 5.

The second embodiment of the present invention will be described with reference to FIGS. 5 and 6. Parts substantially similar to those of the first embodiment will not be further described, but different parts will be only described. The second embodiment is different from the first embodiment only in that an inverting element is shared by all the sub word lines. FIG. 5 is a block diagram schematically illustrating the second embodiment of a semiconductor storage device while FIG. 6 is a circuit diagram illustrating the sub-row selecting means of in FIG. 5.

The second embodiment comprises a memory cell array block 100, memory cells MC, complementary bit line pairs BL and /BL, pre-charge circuits 106 for charging the bit line pairs to "H", a main word line 110 selected when it is in "L" level, sub word lines 112, row address signal lines 114, a main row selecting decoder 116, and a sub row selecting decoder 120.

The main row selecting decoder 116 selects the main word line 110 such that it is connected to the output of the main row selecting decoder 116 depending on an address signal.

The sub row selecting decoder 120 includes second setting means 121 which are formed by gate means 122a–122d and an inverting element 128, as shown in FIG. 5.

A plurality (e.g., four) of gate means are disposed for the number of the sub word lines 112. Each of the gate means receives the output of one sub row address signal line 114 and the output of the inverting element 128. The gate means will select or not select the sub word line 112 connected to the output of that gate means depending on the received address signal. When any one of the sub row address signal lines 114 is actuated, the corresponding gate means is selected. The selected gate means will activate the sub word line 112 only when the logic of the output from the inverting element 128 becomes identical with that of the output from the sub row address signal line 114.

The inverting element 128 is connected between the respective gate means and the main word line 110 and converts and transmits a signal from the main word line 110 to the gate means.

Normal memory cells 102 are arranged in a matrix and connected to the sub word lines 112 as well as the bit line pairs BL and /BL. Each of the sub word lines 112 is connected to one of the gate means 122a–122d and solely selected depending on the condition between the corresponding sub row address signal line 114 and the main word line 110 through the inverting element 128.

In fact, for example, an SRAM of one megabit may includes 1,048,576 memory cells 102, 1,024 bit line pairs, 1,024 sub word lines, 1,024 sub row selecting decoders, 256 main word lines and 256 main row selecting decoders.

The details of the second setting means 121 will be described with reference to FIG. 6. The circuit diagram of FIG. 6 illustrates the details of the sub row selecting decoder 120 shown in FIG. 5.

The second setting means 121 includes a plurality of gate means each of which includes a NAND gate and an inverter.

The gate means 122a–122d have NAND gates 124a–124d each of which receives one of 2-bit sub row address signals supplied from the sub row address signal lines 114 and the output of the inverting element 128.

Each of the inverters 126a–126d is formed, for example, by a pair of complementary transistors and drives the corresponding sub word line 112. The positive power sources of the inverters 126a–126d are connected to a first voltage-boosted line VLINE1 (not shown).

Each of the NAND gates 124a–124d functions as a decoder, one input of which is connected to the corresponding one of the sub row address signal lines 114. The other inputs of the NAND gates 124a–124d are connected to the main word line 110 through the inverting element 128. When a sub word line 112 is selected, therefore, the logic of the output from the corresponding one of the NAND gates will be "H" depending on the row address signal.

The following is a description of the operation of the second embodiment of the present invention.

The operation of the second embodiment will be described with reference to FIG. 6.

When the main word line 110 is in the non-selection state (or in "H"), each of the NAND gates 124a–124d receives an inverted signal "L" from the inverting element 128. Thus, the output of each NAND gate is always in "H" irrespectively of the state of the sub row address signal line 114 which is the other input. Therefore, the sub word line 112 is always in "L" (or in the non-selection state). At this time, the bit line pairs BL and /BL are pre-charged to "H". Since the main word line 110 is also in "H", a short-circuit current will not flow through the main word line 110 even if a short circuit occurs between the bit lines BL, /BL and the main word line 110.

When the main word line 110 is in the selection state (or in "L"), each of the NAND gates 124a–124d receives an inverted signal "H" from the inverting element 128. The output of each NAND gate varies depending on the sate of the corresponding sub row address signal line 114. Only one of the sub row address signal lines 114 becomes "H" while the other sub row address signal lines 114 become "L". For example, only the output of the NAND gate 124a connecting to the "H" signal line is made "L" while the sub word lines 112 connected through the inverter 126a is placed in their "H" state (or in the selection state). At this time, the outputs of the other NAND gates 124b–124d remain in "H". As a result, the sub word lines 112 connected to the inverters 126b–126d also remain in "L" (or in the non-selection state).

Thus, only one of the sub word lines 112 will be selected. The normal operation may be performed with no problem irrespectively of whether the main word line 110 is in the selection state (or in "L") or in the not-selection state (or in "H").

The second embodiment provides the following advantages:

(1) Even if there is a short circuit between the bit lines BL, /BL and the main word line 110, a short-circuit current will not flow through the main word line 110 when it has not been selected. Therefore, by using the row redundancy memory cell and the column redundancy memory cell instead of the malfunctioning normal memory cell, a nondefective product can be provided.

(2) Since the gate means is actuated based on the logics of the outputs from the sub row address signal line and main word line, the sub word lines can be reliably activated or inactivated. Therefore, even if the main word line is placed in its high level potential on occurrence of a short-circuit current, the sub word lines are placed in their low level potential and a signal will not be transmitted from the sub row address signal line to the sub word line so that the sub word line will be inactive. Any failed normal memory cell will not be selected.

(3) Since a single inverting element is shared by all the four gate means unlike the first embodiment, the number of components can be greatly reduced to decrease the semiconductor storage device in size and manufacturing cost. When in such a memory having a plurality of sub word lines, a single inverting element for inverting the signals from the main word and sub word lines is shared by all the gate means, the number of the components inherently functioning as inverting elements can be greatly reduced to decrease the semiconductor storage device in size and manufacturing cost.

The following is a description of a third embodiment of the present invention.

Figure 7:
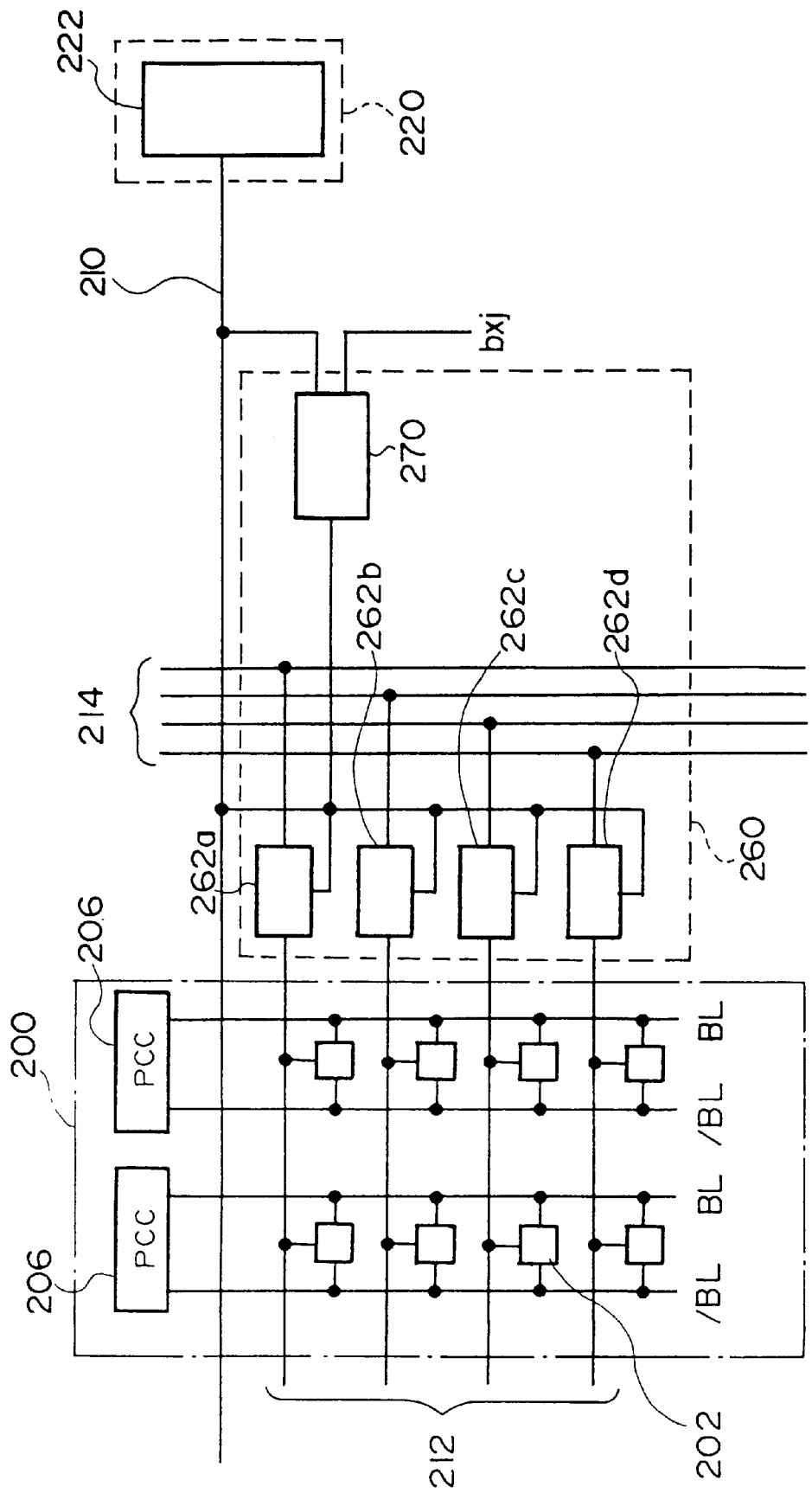
FIG. 7 is a block diagram illustrating still another embodiment of a semiconductor storage device according to the present invention.
Figure 8:
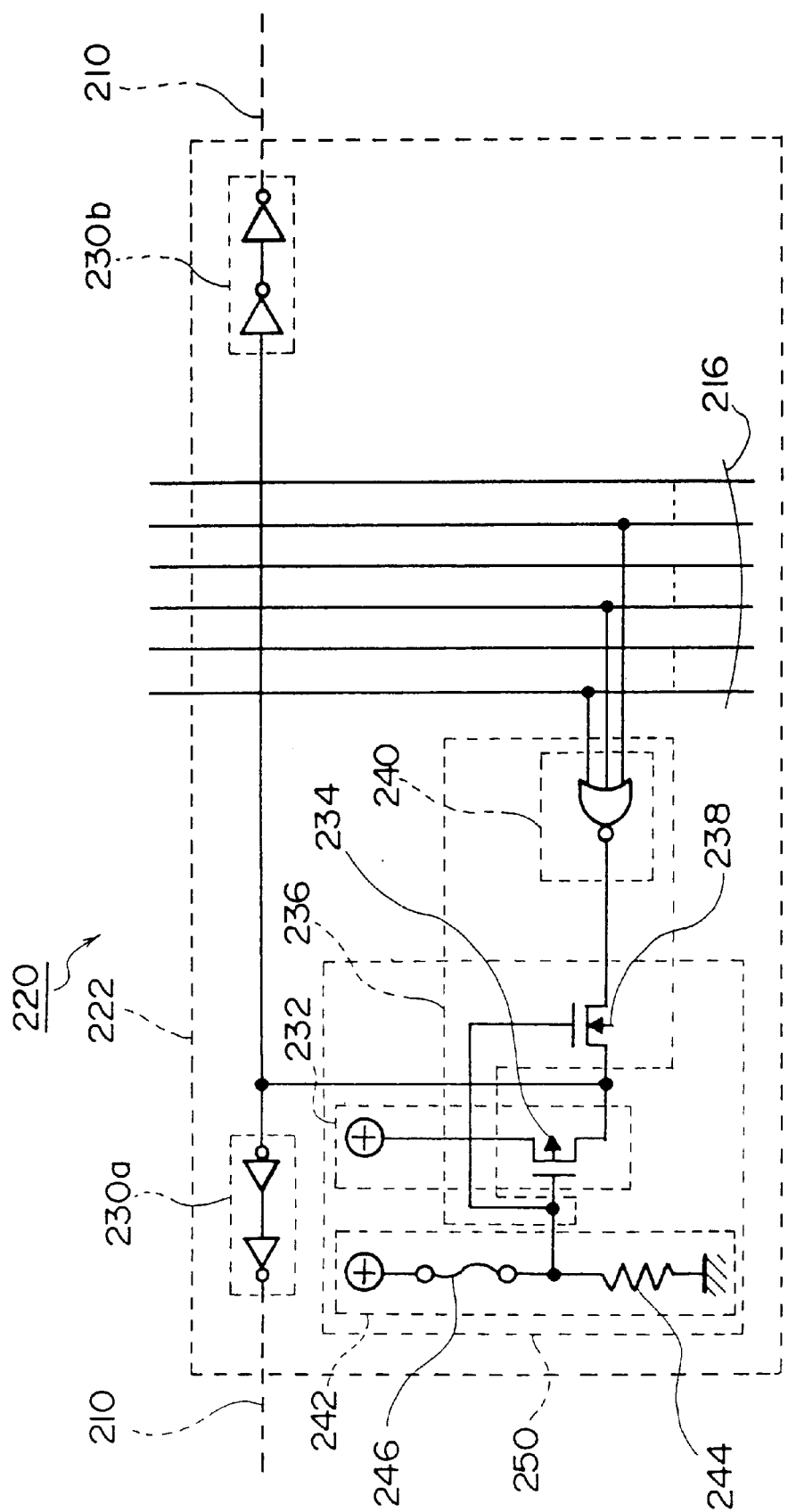
FIG. 8 is a circuit diagram illustrating the details of the main row selecting means shown in FIG. 7.
Figure 9:
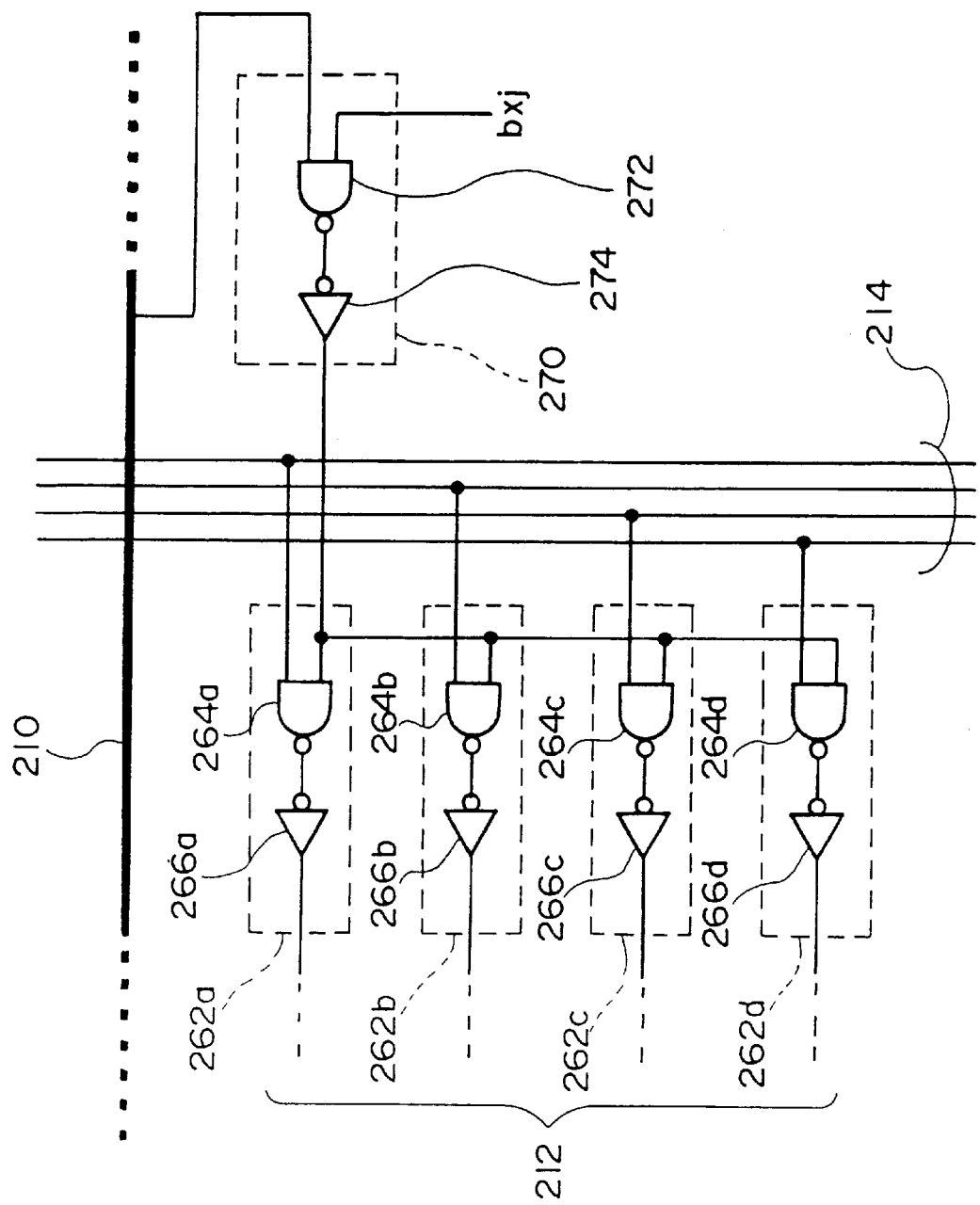
FIG. 9 is a circuit diagram illustrating the details of the sub row selecting means shown in FIG. 7.

The third embodiment will be described with reference to FIGS. 7–9. Parts substantially similar to those of the first embodiment will not be further described, but only different parts will be described. The third embodiment is different from the first embodiment only in that in the selection state, the main word line is placed in its high level potential, and in the non-selection state, the main word line is placed in the low level potential, and that when a redundancy circuit is used, the main word line is fixed to "H" so that the use of the normal memory cells will be inhibited. FIG. 7 is a block diagram illustrating a semiconductor storage device according to the third embodiment; FIG. 8 is a circuit diagram illustrating the details of the main row selecting decoder shown in FIG. 7; and FIG. 9 is a circuit diagram illustrating a sub row selecting decoder usable in the circuit of FIG. 7.

As shown in FIG. 7, the third embodiment includes a memory cell array block 200 including normal memory cells 202; a main word line 210; sub word lines 212; a main row selecting decoder 220; and a sub row selecting decoder 260. Although not illustrated, the third embodiment also includes block selecting decoder 60 and associated change means 62 as described in connection with the first embodiment and illustrated in FIG. 1. However, the last-mentioned components will not be further described.

As shown in FIGS. 7 and 8, the main row selecting decoder 220 comprises a potential setting means 222 connected to the main word line 210.

As shown in FIGS. 7 and 8, the potential setting means 222 sets the potential of the main word line 210 at a level substantially equal to the potential of the pre-charged bit line pairs BL, /BL at all times when the changing is made by the change means shown in FIG. 1 (which will be referred to the non-selection state of the normal memory cells 202). For such a purpose, the potential setting means 222 comprises a drive means, a first potential setting means 232, a second potential setting means 236 and a switchover means 240.

The drive means is connected to the main word line 210 and drives the main word line 210. For such a purpose, the drive means consists of a pair of drivers 230a and 230b each of which is formed by an inverter or the like.

The first potential setting means 232 sets the potential of the main word line 210 connected to a failed normal memory cell 202 at a level substantially equal to the potential of the pre-charged bit lines BL, /BL at all times when the normal memory cells 202 is in the non-selection state. For such a purpose, the first potential setting means 232 may be formed by a first power source and a p-channel transistor 234 which is used as a second switch means, for example.

This p-channel transistor 234 is interposed between the main-row address signal lines 216 and the main word line 210 and includes a gate electrode or control terminal connected to a fuse 246. The p-channel transistor 234 also includes a gate electrode connected to the gate electrode of an n-channel transistor 238 and a source electrode connected to the drain electrode of the n-channel transistor 238.

The second potential setting means 236 activates the main word line 210 with the high level potential for setting the normal memory cells 202 at their selectable state on the basis of a main row address signal from the main row address signal lines 216 when the normal memory cells 202 are in their selection state, that is, when the normal operation is executed without a failure. For such a purpose, the second potential setting means 236 comprises an n-channel transistor 238 used as a firs switch means and a gate means 240.

The p-channel transistor 234 is interposed between a second power source and the main word line 210 and has a gate electrode or control terminal connected to the fuse 246.

In other words, the gate electrodes of the n-channel and p-channel transistors 238, 234 are connected to a junction point between a resistor 244 and the fuse 246, the resistor 244 being connected in series between the first power source and the ground potential. One electrode of each of the transistors 238 and 234 is connected to the inputs of the drivers 230a and 230b. The other electrode of the n-channel transistor 238 is connected to the output of the gate means 240 while the other electrode of the p-channel transistor 234 is connected to the second power source.

The gate means 240 is interposed between the n-channel transistor 238 and the main row address signal lines 216 and activates the main word line 210 only when all the logics of the outputs from main row address signal lines 216 coincide with one another. For example, the gate means may be formed by a NOR gate.

The switchover means 242 functions to make one of the first and second potential setting means 232 and 236 effective and is formed by the first power source, a programming element such as the fuse 246, and the resistor 244. The fuse 246 is interposed and connected between the resistor 244 and the first power source. The resistor 244 is connected to the ground line. Note that a nonvolatile element is also preferable as a programming element.

The main row address signal lines 216 are adapted to permit main row address signals to pass therethrough and may have the total number equal to 20 in maximum in three groups of signal lines if the number of main word lines is equal to 256, for example, although not illustrated. The outputs of the drivers 230a and 230b for driving the main word line are those of the main row selecting decoder 220.

A main word line control means 250 may be formed by the first potential setting means 232, the switchover means 242 and the n-channel transistor 238. In such a case, The main word line control means 250 is interposed between the driver pair 230a, 230b and controls the main word line 210 in response to input signals into the drivers 230a and 230b.

The sub row selecting decoder 260 comprises sub row selecting sections 262a–262d and a sub word line control means 270, as shown in FIG. 9.

Each of the sub row selecting section includes one of NAND gates 264a–246d and one of inverters 266a–266d connected to the output of the corresponding NAND gate and adapted to drive the corresponding sub word line 212.

Each of the NAND gates 264a–264d includes one input connected to one of the sub row address signal lines 214 and the other input connected to a sub word line control means 270.

The control means 270 inactivates the sub word lines (e.g., four lines) connected to the respective normal memory cells 202 at all times on the basis of inhibiting signals bXj that are used to inhibit the selection of a failed normal memory cell 202. The control means 270 includes a gate means 272 and an inverting element 274.

The gate means 272 receives the logic signal from the main word line 210 and the inhibiting signal bXj for inhibiting the selection of the normal memory cell 202 when the redundancy memory cell is being used. The gate means may be formed by a NAND gate.

The inverting element 274 inverts the output of the gate means 272 and to output the inverted signal toward the sub row selecting sections 262a–262d.

The input of the gate means 272 receives the signal of the main word line 210 and the inhibiting signal bXj. The output of the gate means 272 is inverted by the inverting element 270, the inverted signal being then inputted into all the NAND gates 264a–264d of the sub row selecting section 262a–262d.

The inhibiting signal bXj is one that is inputted into a normal address decoder circuit not to select any normal memory cell when a redundancy memory cell is being used. At this time, the inhibiting signal is in "L".

The following is a description of the operation of the third embodiment of the invention.

The operation of the third embodiment will be described with reference to FIGS. 7 to 9.

In the main row selecting decoder 220, the fuse 246 will not be disconnected when there is no short circuit between the bit lines BL, /BL and the main word line 210 and if there is no failed memory cell, as shown in FIG. 8. At this time, the junction point between the fuse 246 and the resistor 244 becomes "H". Thus, the p-channel transistor 234 is turned off and the n-channel transistor is turned on. The output of the gate means 240 is transmitted to the inputs of the drivers 230a and 230b. Thus, the normal operation will be carried out.

If a normal memory cell fails for a reason other than the short circuit between the bit lines BL and the main word line 210 and when a redundancy memory cell is to be used, the fuse 246 will not be disconnected. At this time, the inputs of the drivers 230a and 230b become the output of the gate means 240. When the redundancy memory cell is being used, however, the output of the gate means 240 becomes "L" since the main row address signal inputted into the gate means 240 is not a signal for selecting the main word line 210. Thus, the main word line 210 is fixed to "L" and the sub word lines 212 depending on this main word line 210 are also fixed to "L" or the non-selection state. Thereafter, a redundancy memory cell will be selected and substituted for the failed normal memory cell 202.

If a short circuit occurs between the bit lines BL and the main word line 210, the fuse 246 will be disconnected. Thus, the potential at the junction point between the fuse 246 and the resistor 244 becomes the ground potential ("L"). The n-channel transistor 238 is turned off and the p-channel transistor 234 is turned on. The output of the gate means 240 will not be transmitted to the drivers 230a and 230b. As a result, the inputs of the drivers 230a and 230b are fixed to "H".

Therefore, the main word line 210 is fixed to "H" and will have a potential equal to that of the pre-charged bit lines BL (which is in the non-selection state or "H"). Even if a short circuit occurs due to a foreign matter entering between the metal layer of the bit lines BL and the other metal layer of the main word line 210 during the manufacturing process, therefore, a short-circuit current will not flow through the main word line 210. It is now assumed that the sub row selecting decoder is not adapted to select the sub word lines even when the main word line 210 is in "H".

On the other hand, in the normal operation wherein no redundancy memory cell is used, the main word line 210 of FIG. 9 becomes "H" in the selection state and "L" in the non-selection state. The inhibiting signal bXj is in "H". At this time, the output of the gate means 272 depends on the potential of the main word line 210. In other words, the state of the main word line 210 will be directly inputted into the sub row selecting sections 262a–262d when the inhibiting signal bXj is in "H".

When a redundancy memory cell is to be used, the main word line 210 is fixed to "H". The inhibiting signal bXj becomes "L". At this time, the output of the gate means 272 becomes "H". The sub row selecting sections 262a–262d receive a signal "L" outputted from the gate means 272 and also inverted by the inverting element 274.

Therefore, the outputs of the NAND gates 264a–264d in the sub row selecting sections become "H" while the sub word lines 212 becomes "L" (or the non-selection state) inverted by the inverters 266a–266d. No normal memory cell 202 will be selected. Note that instead of a fuse, a transistor having a floating gate or a ROM memory cell element can be used, for example.

The third embodiment provides the following advantages:

(1) Even if a short circuit occurs between the main word line 210 and the bit lines BL, a short-circuit current will not flow through the main word line 210 since the main word line 210 is in "H" and the bit lines BL and /BL are in "H" (or in the non-selection state). A nondefective semiconductor storage device can be provided when a failure in operation is prevented by simultaneously using both the row and column redundancy memory cells.

(2) By providing the potential setting means for setting the potential of the main word line at a level equal to that of the bit lines when no normal memory cell is selected, any overcurrent will not flow through the memory cell array block even if a short circuit occurs between the bit lines and the main word line due to a foreign matter between the bit line layer and the main word line layer. Thus, the redundancy memory cell can be well driven to improve the quality. Furthermore, the other components can be prevented from malfunctioning. Since the change means is provided, the main word line can be set at a high level in the conventional manner when there is no short circuit. Thus, a sub word line can be activated to select a normal memory cell.

More particularly, a main word line which has selected a normal memory cell is fixed to a high level potential by the potential setting means only when the change means changes a failed normal memory cell for a redundancy memory cell because of a short circuit between the main word line and the bit lines.

The control means can prevent the inflow of the short-circuit current, the malfunction of the normal memory cell and others by inactivating a sub word line depending on a failed normal memory cell. The failure in operation can be prevented by using the redundancy memory cell. This can improve the yield. At this time, the normal memory cell will not be selected in spite of the logic of the sub row address signal since the inhibiting signal for inhibiting the selection of normal memory cell is supplied to the control means.

(3) When a short circuit occurs, the first potential setting means can fix the main word line as at a high level to prevent a short-circuit current from flowing through the main word line. In the normal operation or when the normal memory cell is selected, the potential of the main word line is at the high level. When no normal memory cell is selected, the potential of the main word line is at the low level. Only when a short circuit occurs, therefore, the switchover means halts the second potential setting means and uses the first potential setting means to deal with the short circuit effectively.

(4) When a redundancy memory cell is to be selected, the fuse can be disconnected to maintain the main word line at the high level potential. In the normal operation, the fuse will not be disconnected. Therefore, the selection of normal memory cell can be carried out since the sub word lines can be activated when the main word line is in the high level potential.

(5) When the main word line is in the high level potential, the inhibiting signal can be arrested to perform the selection of normal memory cell. When the main word line is in the low level potential, the inhibiting signal is outputted to arrest the selection of normal memory cell. In such a manner, the gate means can depend on the logic of the main word line to simplify the logic of the control means.

Even though the embodiment of FIG. 9 is set to be active when the inhibiting signal bXj is in "H" and if the potential of the main word line can be shifted to a level equal to that of the bit lines so that the sub word lines will be in the non-selection state, the advantages of the present invention can be provided.

Figure 10:
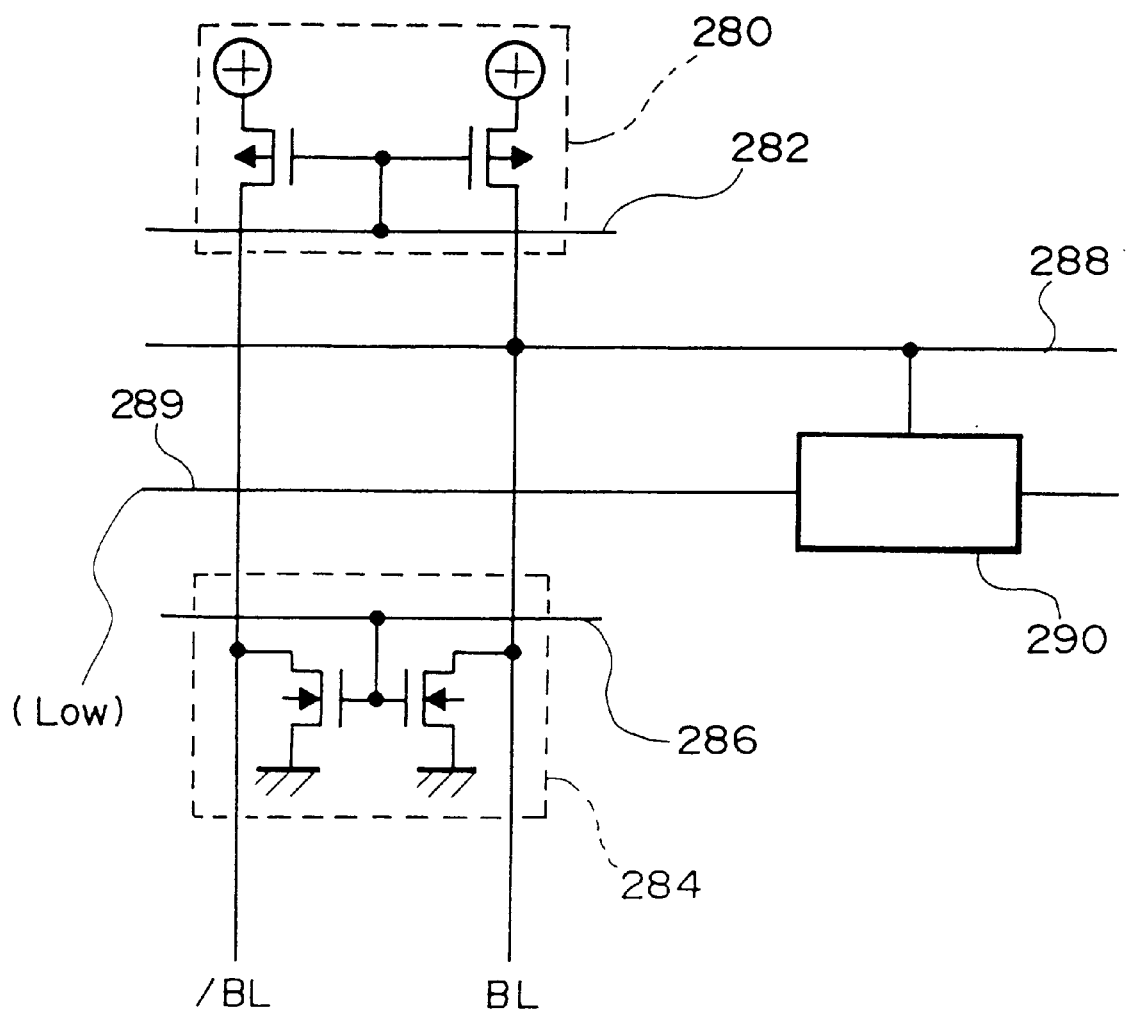
FIG. 10 is a circuit diagram of a modified bit line pre-charge circuit in a further embodiment of a semiconductor storage device according to the present invention.

As shown in FIG. 10, the bit line pair may be fixed to "L" level during the stand-by state by a discharge circuit 284 and pre-charged by a pre-charge circuit 280 immediately before selection.

More particularly, as shown in FIG. 10, pre-charging of the bit line may be controlled by control signals PC282, 286 when the potential of the bit lines BL and /BL is in "L" in the stand-by state. These PC signals are in "H" when the bit lines are in the non-selection state and in "L" when the bit lines are in the selection state, and becomes "L" immediately before shift to the selection state. In the stand-by state, thus, the discharge circuit 284 sets the potential of the bit lines at "L". Immediately before initiation of the operation, the discharge circuit 284 is inactivated and the pre-charge circuit 280 is activated. As a result, the potential of the bit liens are set at "H".

Figure 11:
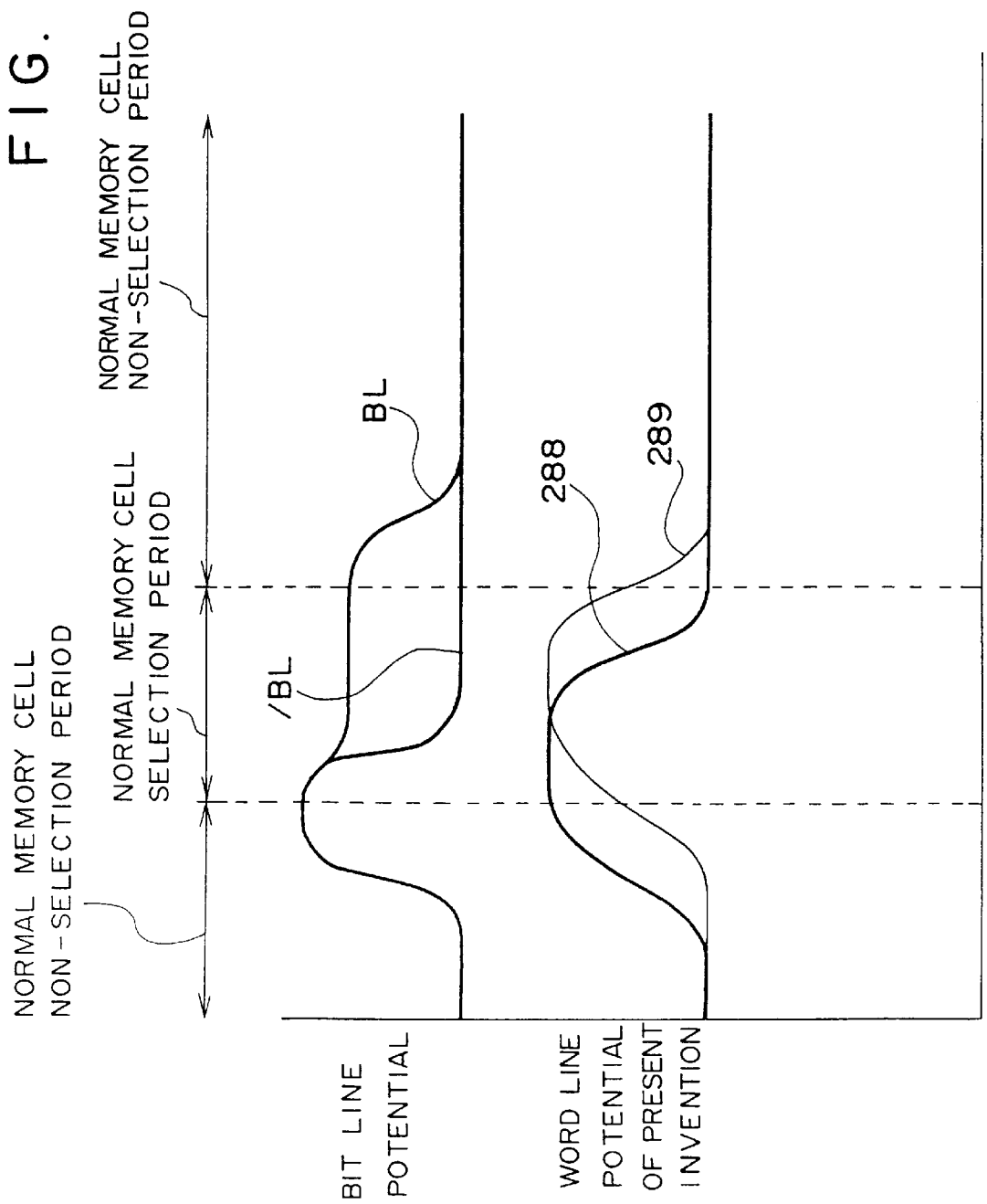
FIG. 11 is a graph of the potential states in the word lines of the semiconductor storage device according to the present invention when the bit line has already been set to "L".

FIG. 11 illustrates when the potential level of the bit lines is in "L" in the non-selection state. When the main word line 288 is shifted from the non-selection state ("L") to the selection state ("H"), both the bit lines BL and /BL are once pre-charged to "H" from "L" immediately before the sub word line 289 is shifted to the selection state and thereafter set at "H" and "L", respectively. When the main word line 288 is shifted to the non-selection state ("L"), the sub word line 289 is also shifted to the non-selection state ("L"). The bit lines are shifted to "L" by the discharge circuit 284.

The following is a description of a fourth embodiment of the invention.

The fourth embodiment of the present invention will be described with reference to FIG. 12. Parts substantially similar to those of the first embodiment will not be further described, but only different parts will be described. The fourth embodiment is an example of the arrangements usable in the semiconductor storage devices described in connection with the first and second embodiments.

Figure 12:
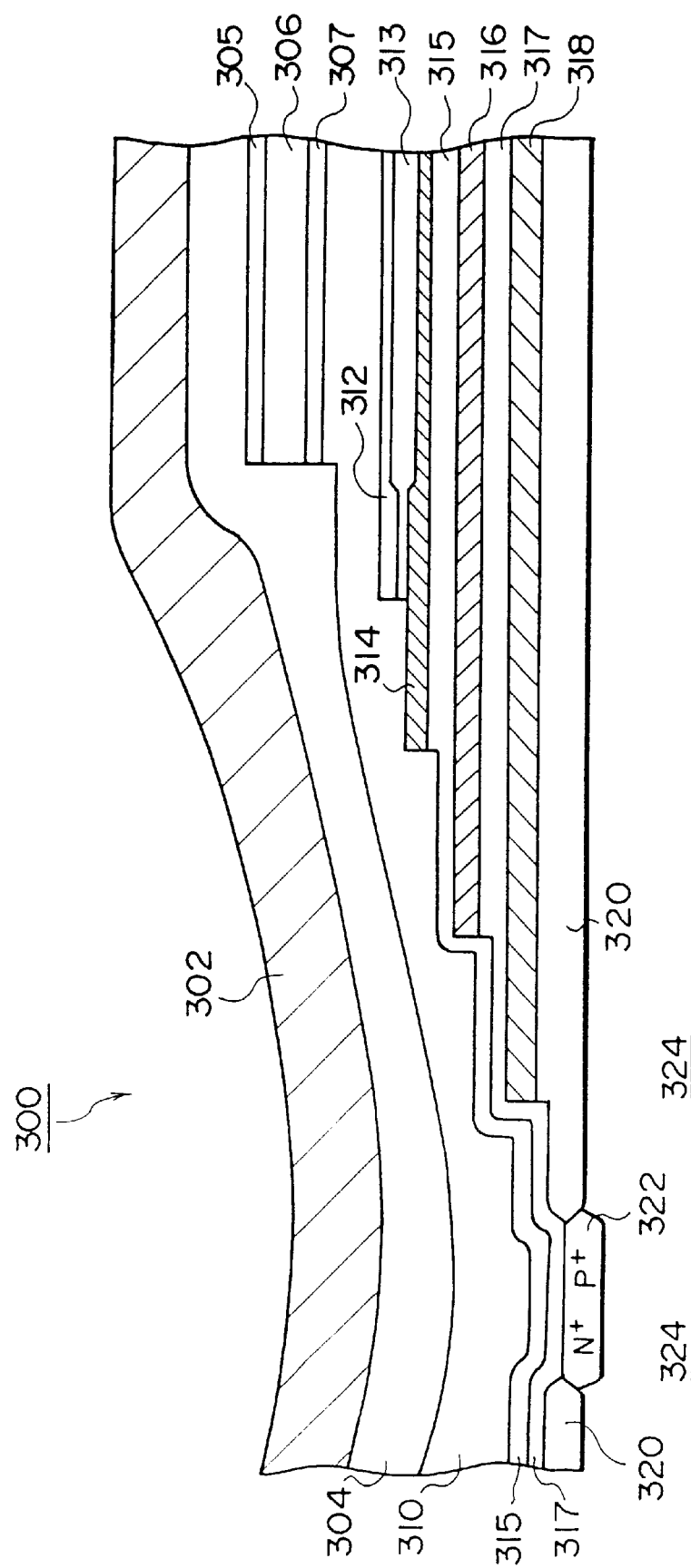
FIG. 12 is a cross-sectional view of the semiconductor storage device shown in FIG. 3.
Figure 13A:
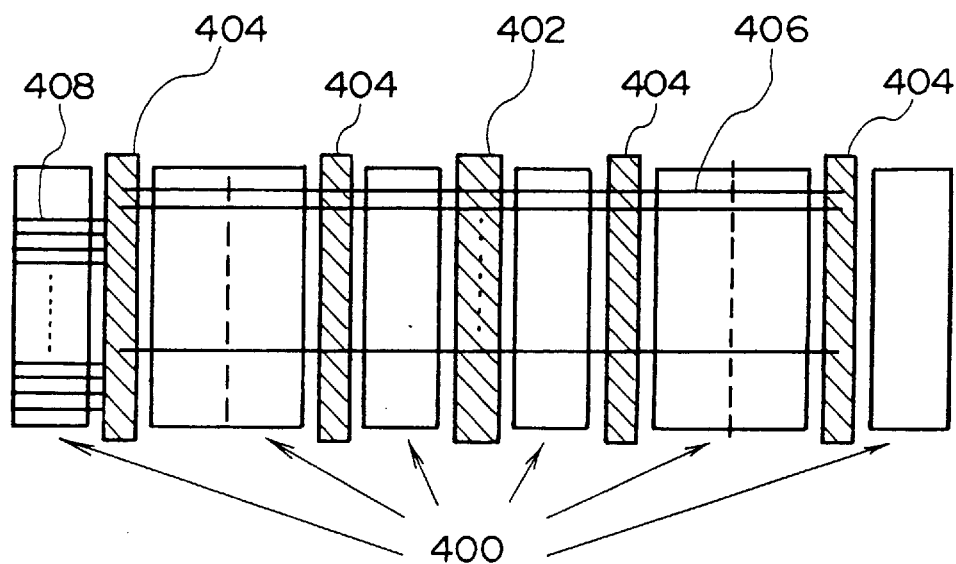
FIG. 13A is a schematic block diagram of a known divided-word-line type semiconductor storage device.
Figure 13B:
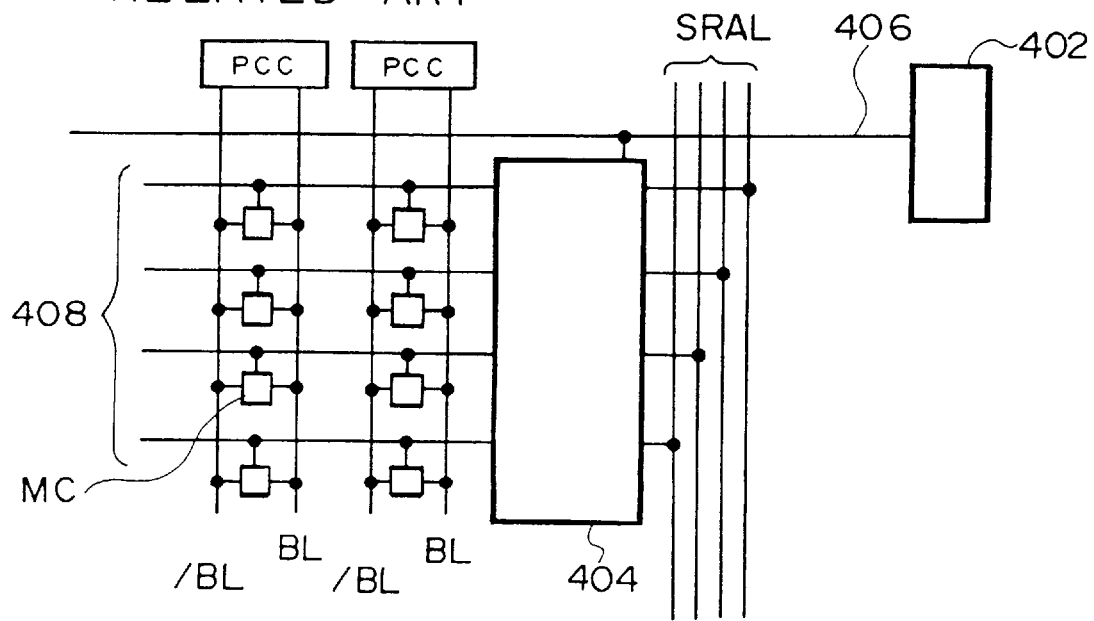
FIG. 13B is a block diagram illustrating, in an enlarged scale, memory cells shown in FIG. 13A.
Figure 14:
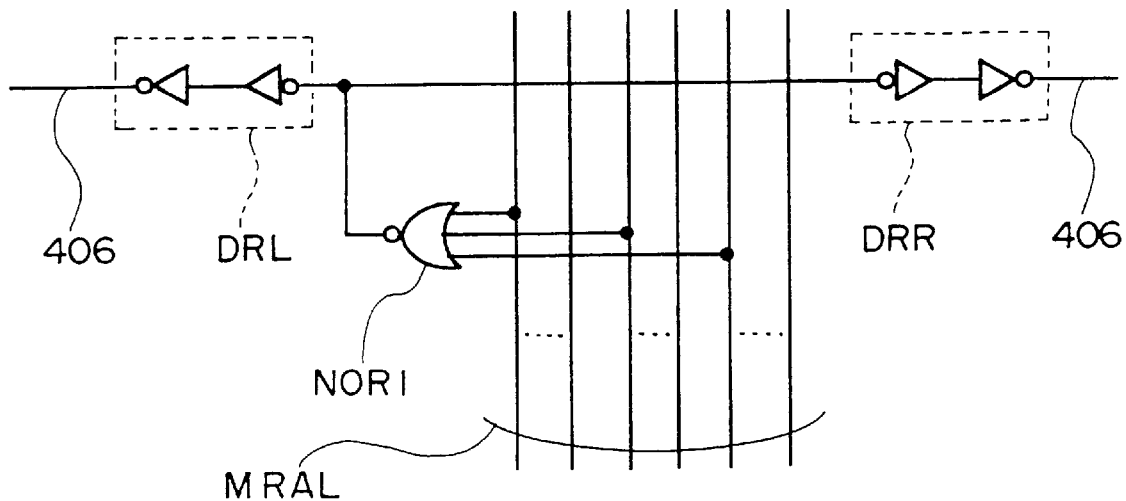
FIG. 14 is a circuit diagram illustrating, in an enlarged scale, the main row decoder area of FIG. 13A.
Figure 15:
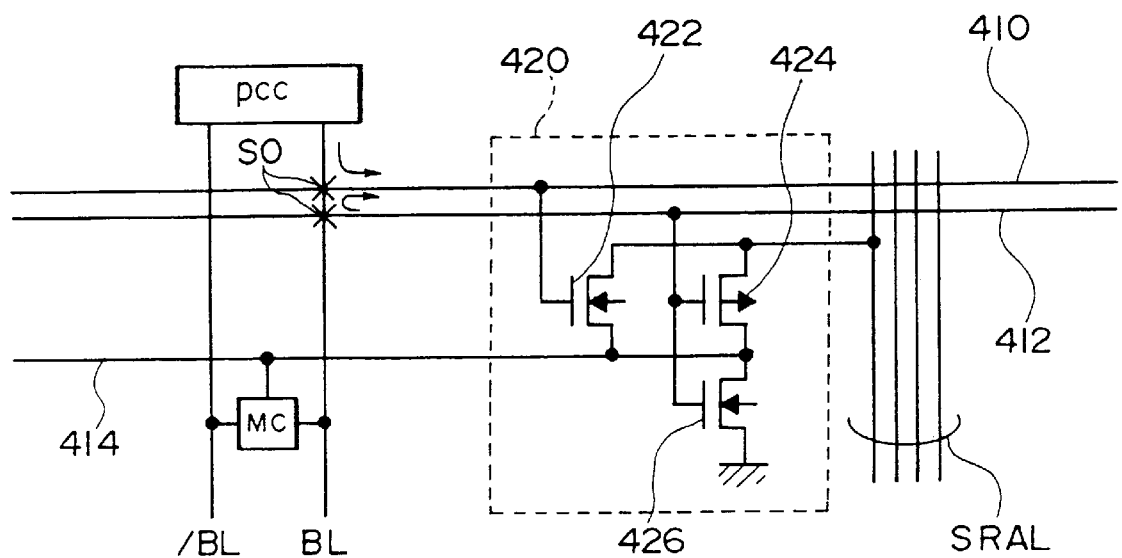
FIG. 15 is a block diagram of a known sub row decoder in another form of a semiconductor storage device.

As shown in FIG. 12, a memory cell 300 comprises, in the order described from the top to the bottom, a main word line 302, an organic layer (SOG) 304, a bit line layer consisting of a TiN layer 305, a metal layer 306 and a TiN layer 307, a BPSG 310, a polysilicon D layer 312, an insulation layer 313, a polysilicon C layer 314, an insulation layer 315, a polysilicon B layer 316, an insulation layer 317, a polysilicon A layer 318, an element separation film 320, an active field 322 and a substrate 324.

The optimum interlayer thickness of these layers are shown in Table 1.

TABLE 1

| | Interlayer Thickness (Å) $^{MAX}TYP_{MIN}$ | | | | | | |
|---|---|---|---|---|---|---|---|
| No. | 324 | 322 | 318 | 316 | 314 | 312 | 306 |
| 302 | $^{14000}12000_{10000}$ | $^{10000}9000_{8000}$ | $^{10000}9000_{8000}$ | $^{9000}8000_{7000}$ | $^{8000}7000_{6000}$ | $^{8000}7000_{6000}$ | $^{5000}4000_{3000}$ |
| 306 | $^{10500}9000_{7500}$ | $^{7000}6000_{5000}$ | $^{7000}6000_{5000}$ | $^{6000}5000_{4000}$ | $^{5000}4000_{3000}$ | $^{5000}4000_{3000}$ | |
| 312 | $^{6200}5600_{5000}$ | $^{2600}2300_{2000}$ | $^{2600}2300_{2000}$ | $^{1500}1300_{1100}$ | $^{350}300_{250}$ | | |
| 314 | $^{5300}4800_{4300}$ | $^{2800}2500_{2200}$ | $^{2800}2500_{2200}$ | $^{1700}1500_{1300}$ | | | |
| 316 | $^{5000}4500_{4000}$ | $^{1400}1200_{1000}$ | $^{1400}1200_{1000}$ | | | | |
| 318 | $^{4000}3600_{3200}$ | $^{110}100_{80}$ | | | | | |

As will be apparent from the above Table 1, the interlayer thickness between the main word line 302 and the metal layer 306 is preferably between 3000 Angstroms and 5000 Angstroms and more preferably equal to 4000 Angstroms.

The electrostatic capacity C in the memory cell 300 at each layer can be represented by the following formula 1:

$$C = Ca \cdot A + Cp \cdot P$$
$$= \frac{\varepsilon_o \cdot \varepsilon_{ox}}{t_{ox}} 1.15 \cdot A + \varepsilon_o \cdot \varepsilon_{ox} \cdot 1.40 \cdot \left(\frac{H}{t_{ox}}\right)^{0.222} \cdot P$$

where A is a layer area; Ca a unit area capacity; P a length; Cp a unit length capacity; H a film thickness of each layer (as shown in Table 1); $t_{OX}$ a gate oxide film thickness (which is measured from the ground face to the bottom of each layer); $\varepsilon_0 = 8.854633 \times 10^{-12}$ [F/m]; and $e_{OX} = 4$.

Although not calculated, the respective electrostatic capacities calculated by the use of the formula 1 on the basis of the data in Table 1 should be read preferably as $C_{MAX}$ to $C_{MIN}$ and more preferably $C_{TYP}$. The results calculated by the formula 1 can also provide the advantages of the electrostatic capacity inherent in the memory cell 300 of the present invention.

The layer of the main word line 302 is formed of a metallic material such as Al—Cu and preferably has its film thickness equal to 8600 Angstroms. The layer of the organic SOG 304 preferably has its film thickness equal to 4000 Angstroms. The three layers of TiN 305, metal layer 306 and TiN 307 are bit lines and preferably have their film thickness equal to 6200 Angstroms. The metal layer 306 is formed, for example, of Al—Cu.

The layer of the BPSG 310 preferably has its film thickness equal to 4000 Angstroms at an area formed below the layers of TiN 305, 307, and the metal layer 306 and equal to 3000 Angstroms at another area formed below the organic SOG 304.

The polysilicon D layer 312 preferably has its film thickness equal to 350 Angstrom and functions as a thin film transistor (TFT) field. The film thickness of the insulation layer 313 is preferably equal to 300 Angstroms. The polysilicon C layer 314 preferably has its film thickness equal to 1000 Angstroms and functions as a TFT gate. The film thickness of the insulation layer 315 is preferably equal to 1500 Angstroms at an area below the polysilicon C layer 314 and preferably equal to 1000 Angstroms at another area below the BPSG 310.

The film thickness of the polysilicon B layer 316 is preferably equal to 2000 Angstroms. The film thickness of the insulation layer 317 is preferably equal to 1200 Angstroms at an area below the polysilicon B layer 316 and preferably equal to 1000 Angstroms at another area below the insulation layer 315. The film thickness of the polysilicon A layer 318 is preferably equal to 2500 Angstroms.

The element separation film 320 is formed, for example, of $SiO_2$ and has its film thickness preferably equal to 3600 Angstroms at an area below the polysilicon A layer 318 and preferably equal to 3300 Angstroms at another area below the insulation layer 317.

As described in the fourth embodiment, by reducing the thickness of the insulation layers, a contact hall can be formed more easily. By forming the bit lines and main word line with the insulation film therebetween, the insulation can be reliably made between the bit lines and the main word line even if they are formed of metal. Even if a short circuit occurs between the bit lines and the main word line due to the entry of a foreign matter during the manufacturing process, no problem will be raised. This improves the semiconductor storage device.

Although the apparatus and method according to the present invention have been described in connection with some specific embodiments, these embodiments may be modified and changed into various forms without departing from the spirit and scope of the invention. For example, the redundancy memory cells may be formed only in the direction of row or column unless they match the normal memory cells in the memory cell block. The redundancy memory cells may be formed at any location other than adjacent to the normal memory cells.

Although the memory cell array has been described to be divided into 16 blocks in the first embodiment, it may be divided into any number of blocks, for example, 4, 8, 24, 32 or 64.

Although the row redundancy memory cell array has been described to be included in the upper portion of the memory cell array block, they may be separated from each other. In such a case, the main row selecting decoders for row redundancy memory cells may be provided independently of the main row selecting decoders for the normal memory cells.

Although it has been described that one column redundancy memory cell array block is formed in one memory cell array block, a plurality of column redundancy memory cell blocks may be formed.

The ground and word lines of the memory cell may be formed of any low-resistance and high-melting metal such as a polycide or silicide including Mo, Co, Ni, or Ta.

Although the embodiments have been described as to SRAM, the present invention is not limited to it, but may be applied to DRAM, EEPRO or the like if it is a divided-word-line type device.

The semiconductor storage device of the present invention may be applied to electronic equipment. Even if a plurality of short-circuit areas are formed in a semiconductor storage device being produced, the electronic equipment can be manufactured with improved quality. This also means that the number of usable chips is increased without wastefulness, thereby improving the yield and quality. The semiconductor storage device of the present invention can be preferably used in any type of electronic equipment as a storage device.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A semiconductor storage device comprising;
   a plurality of normal memory cell array blocks, each of the normal memory cell array blocks including multiple columns of bit line pairs, rows of sub word lines and a plurality of normal memory cells disposed at respective intersections between said multiple columns of bit line pairs and said N×n rows of sub word lines, said sub word lines being divided into a plurality of blocks in a column direction;
   N rows of main word lines extending through said plurality of memory cell array blocks, wherein n of said sub word lines depending on one of said main word lines come into a selectable state by activating said one of said main word lines;
   main row selecting means used by all of said normal memory cell array blocks for selecting one of said main word lines on the basis of a main row address signal;
   block selecting means, each of the block selecting means provided for one of said normal memory cell array blocks, for outputting a sub row address signal for selecting one of said sub word lines within corresponding one of said normal memory cell array blocks on the basis of a block address signal;
   sub row selecting means, each of the sub row selecting means provided for one of said normal memory cell array blocks, for selecting one of said n sub word lines depending on one of said main word lines selected based on said main row address signal on the basis of said sub row address signal; and
   pre-charge means for pre-charging one of said multiple columns of bit line pairs;
   wherein said main row selecting means activates and selects one of said main word lines at a low potential level and inactivates the other main word lines at a high potential level, said high potential level being substantially equal to a potential level of a pre-charged bit line pair of said plural columns of bit line pairs, wherein said main row selecting means includes a first setting means for activating and selecting one of said main word lines at a low potential level and for inactivating the other main word lines at a high potential level, said high potential level being substantially equal to a potential level of said pre-charged bit line pair;
   said sub row selecting means includes a second setting means, disposed between one of said main word lines and one of said sub word lines, for inactivating said one of said sub word lines when said one of said main word lines is at a high potential level; and said second setting means includes:
      an inverting element which receives a signal from said one of said main word lines to invert and output a received signal; and
      switch means for activating said one of said sub word lines when an output of said inverting element is at a low potential level.

2. The semiconductor storage device as defined in claim 1, further including at least one sub row address signal line which is connected between said sub row selecting means and said block selecting means to be activated by said sub row address signal; and
   wherein said switch means includes:
      a first switch for activating said one of said sub word lines when said one of said main word lines and said at least one sub row address signal line are active; and
      a second switch for lowering the potential of said one of said sub word lines to a ground potential to inactivate said one of said sub word lines on the basis of an output of said inverting element when said one of said main word lines is inactive.

3. The semiconductor storage device as defined in claim 2, wherein said first switch is formed by a transmission gate disposed between said one of said sub word lines and said at least one sub row address signal line; and
   a first control terminal and a second control terminal of said transmission gate are connected to said one of said main word lines and the output of said inverting element, respectively, for controlling a continuity between said one of said sub word lines and said at least one sub row address signal line.

4. The semiconductor storage device as defined in claim 3, wherein said second switch is a switching element which is connected between said one of said sub word lines and a ground line and controlled by the output of said inverting element.

5. The semiconductor storage device as defined in claim 1, further including at least one sub row address signal line which is connected between said sub row selecting means and said block selecting means to be activated by said sub row address signal; and
   wherein said second setting means has gate means for receiving an output of said at least one sub row address signal line and the output of said inverting element, and activating said one of said sub word lines when said one of said main word lines and said at least one sub row address signal line depending on said one of said main word lines are active, and inactivating said one of said sub word lines when said one of said main word lines is inactive.

6. A semiconductor storage device comprising:
   a plurality of normal memory cell array blocks, each of the normal memory cell array blocks including multiple columns of bit line pairs, N×n rows of sub word lines and a plurality of normal memory cells disposed at respective intersections between said plural columns of bit line pairs and said N×n rows of sub word lines, said sub word lines being divided into a plurality of blocks in a column direction;
   redundancy memory cell array blocks, each of the redundancy memory cell array blocks is provided for one of said normal memory cell array blocks, and has a redundancy memory cell which can be substituted for any failed one of said normal memory cells;
   N rows of main word lines extending through said plurality of normal memory cell array blocks and said redundancy memory cell array blocks, wherein n of said sub word lines depending on one of said main word lines come into a selectable state by activating said one of said main word lines;
   main row selecting means which is used by all of said normal memory cell array blocks for selecting one of said main word lines by setting a potential of said one of said main word lines at a high potential level on the basis of a main row address signal;

block selecting means, each of the block selecting means provided for one of said normal memory cell array blocks, for outputting a sub row address signal for selecting one of said sub word lines within corresponding one of said normal memory cell array blocks on the basis of a block address signal;

sub row selecting means, each of the sub row selecting means provided for one of said normal memory cell array blocks, for selecting one of said n sub word lines depending on one of said main word lines selected by said main row address signal on the basis of said sub row address signal;

pre-charge means for pre-charging one of said multiple columns of bit line pairs; and at least one sub row address signal line which is connected between said sub row selecting means and said block selecting means to be activated by said sub row address signal;

wherein said block selecting means has change means for changing a failed one of said normal memory cells for a redundancy memory cell in said redundancy memory cell array block in response to a redundancy selection signal used for selecting said redundancy memory cell;

wherein said main row selecting means has potential setting means for setting a potential of one of said main word lines used to select a failed one of said normal memory cells at a high potential level substantially equal to a potential level of pre-charged one of said bit line pairs at all times when said change means changes the failed one of said normal memory cells for said redundancy memory cell;

said sub row selecting means has control means, responsive to an inhibiting signal activated when the selection of the failed one of said normal memory cells is inhibited, to inactivate n of said sub word lines connected to the failed one of said failed normal memory cells; and said potential setting means includes:
  first potential setting means for setting a potential of said one of said main word lines substantially equal to a potential of pre-charged one of said bit line pairs always at a time of changing by said change means;
  second potential setting means for setting one of said main word lines to a high potential level based on an output of said main row address signal to make said normal memory cells to come into a selectable state before the changing by said change means; and
  switchover means for performing the switching of said first potential setting means and said second potential setting means from one to another.

7. The semiconductor storage device as defined in claim 6, further including at least one main row address signal line which is connected to said main row selecting means and activated by said main row address signal; and wherein said switchover means has a programming element interposed and connected between a ground line and a first power source;

wherein said second potential setting means includes a first switch which is disposed between a second power source and one of said main word lines, the first switch includes a first control terminal, the first control terminal of said first switch being connected to said programming element; and wherein said first potential setting means includes a second switch which is disposed between said at least one main row address signal line and said one of said main word lines, the second switch includes a second control terminal, the second control terminal of said second switch being connected to said programming element.

8. The semiconductor storage device as defined in claim 6, wherein said control means includes gate means, disposed between one of said main word lines and one of said sub word lines, for inactivating said one of said sub word lines independently of a logic of said sub row address signal when said inhibiting signal is active.

9. The semiconductor storage device as defined in claim 1, further including an insulation film which is interposed between said multiple columns of bit line pairs and said N rows of main word lines.

10. An electronic equipment having the semiconductor storage device as defined in claim 1.

11. The semiconductor storage device as defined in claim 6, further including an insulation film which is interposed between said multiple columns of bit line pairs and said N rows of main word lines.

12. An electronic equipment having the semiconductor storage device as defined in claim 6.

* * * * *